(12) United States Patent
Fukushi et al.

(10) Patent No.: US 10,891,986 B2
(45) Date of Patent: Jan. 12, 2021

(54) SEMICONDUCTOR DEVICE

(71) Applicant: RENESAS ELECTRONICS CORPORATION, Tokyo (JP)

(72) Inventors: Tetsuo Fukushi, Tokyo (JP); Hiroyuki Takahashi, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/375,580

(22) Filed: Apr. 4, 2019

(65) Prior Publication Data

US 2019/0333546 A1    Oct. 31, 2019

(30) Foreign Application Priority Data

Apr. 25, 2018    (JP) .................... 2018-084187

(51) Int. Cl.
*G11C 5/06* (2006.01)
*G11C 7/10* (2006.01)
*G11C 8/06* (2006.01)
*G11C 7/06* (2006.01)

(52) U.S. Cl.
CPC ............. *G11C 5/06* (2013.01); *G11C 7/06* (2013.01); *G11C 7/1087* (2013.01); *G11C 7/1096* (2013.01); *G11C 8/06* (2013.01)

(58) Field of Classification Search
CPC .................................. G11C 8/10; G11C 5/06
USPC ............................................. 365/63, 230.06
See application file for complete search history.

(56) References Cited

U.S. PATENT DOCUMENTS

| 6,130,852 | A | 10/2000 | Ohtani et al. | |
|---|---|---|---|---|
| 2006/0145193 | A1* | 7/2006 | So | G11C 8/10 257/208 |
| 2009/0213639 | A1* | 8/2009 | Toda | G11C 13/0002 365/148 |
| 2013/0003433 | A1* | 1/2013 | Hishida | G11C 5/025 365/51 |
| 2014/0289574 | A1* | 9/2014 | Tsern | G06F 11/1008 714/718 |
| 2014/0313809 | A1* | 10/2014 | Son | G11C 8/10 365/63 |
| 2016/0064452 | A1* | 3/2016 | Ueda | H01L 27/228 365/148 |
| 2017/0077119 | A1* | 3/2017 | Sawabe | H01L 27/11582 |
| 2017/0294375 | A1* | 10/2017 | Terada | H01L 51/05 |
| 2018/0277202 | A1* | 9/2018 | Iizuka | G11C 7/04 |
| 2018/0277746 | A1* | 9/2018 | Abe | G11C 11/1659 |

(Continued)

FOREIGN PATENT DOCUMENTS

JP    2007-184101 A    7/2007

*Primary Examiner* — Michael T Tran
(74) *Attorney, Agent, or Firm* — McDermott Will & Emery LLP

(57) ABSTRACT

The subject in the past is that there are a large number of data wirings in a semiconductor device including multiple memory cell arrays and that the area occupied by the data wirings is large. In a selected memory cell array among multiple memory cell arrays, a data wiring functions as a local wiring that transmits the data of the selected memory cell. In a memory cell array that is not selected among the memory cell arrays and is located between a data circuit and the selected memory cell array, the data wiring functions as a global wiring that transmits the data of a memory cell of the selected memory cell array.

16 Claims, 20 Drawing Sheets

(56) References Cited

U.S. PATENT DOCUMENTS

| | | | |
|---|---|---|---|
| 2018/0308853 A1* | 10/2018 | Bell | H01L 27/1112 |
| 2018/0315769 A1* | 11/2018 | Huo | H01L 29/10 |
| 2018/0337054 A1* | 11/2018 | Sung | H01L 27/11565 |
| 2019/0043872 A1* | 2/2019 | Oh | H01L 27/11575 |
| 2019/0066743 A1* | 2/2019 | Dodge | G11C 5/063 |
| 2019/0067371 A1* | 2/2019 | Pirovano | H01L 27/2409 |
| 2019/0384735 A1* | 12/2019 | Schmitz | G06F 13/42 |
| 2020/0251152 A1* | 8/2020 | Bhargava | G11C 14/009 |
| 2020/0257619 A1* | 8/2020 | Sheffler | G11C 7/1006 |
| 2020/0273508 A1* | 8/2020 | Srinivasan | G11C 8/10 |
| 2020/0278790 A1* | 9/2020 | Shin | G11C 7/10 |

\* cited by examiner

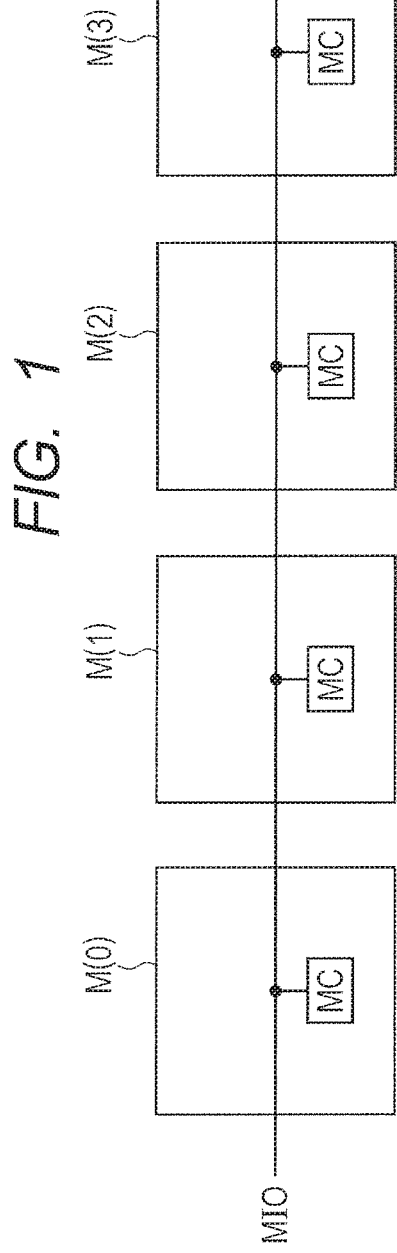
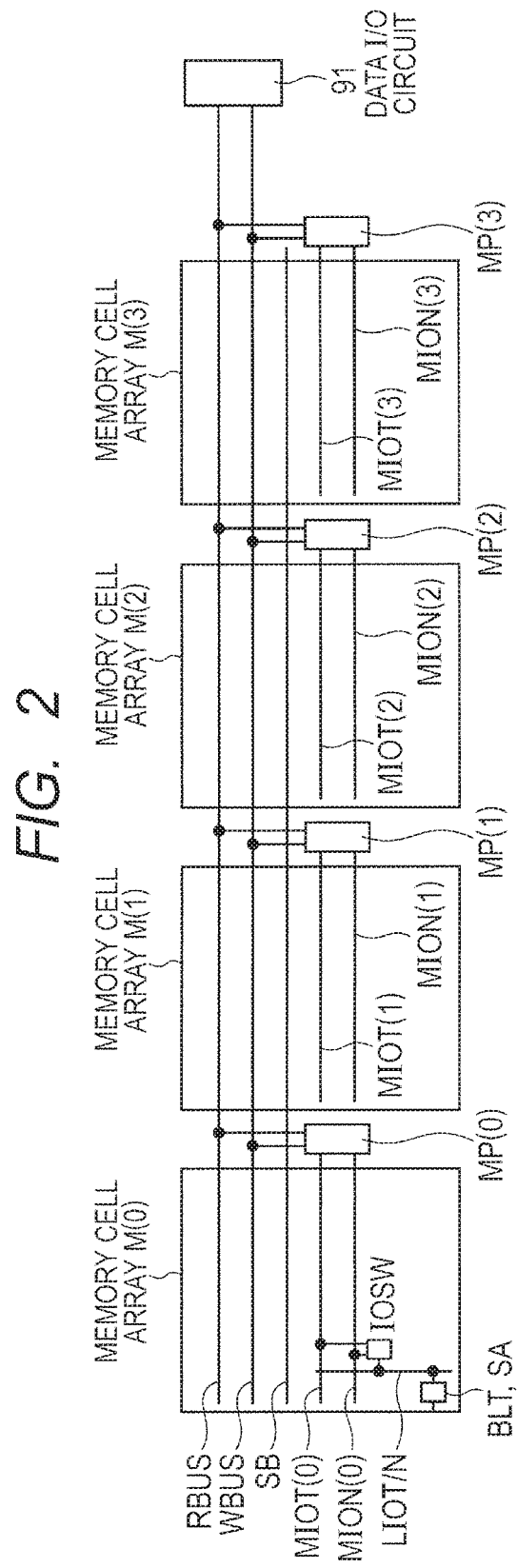

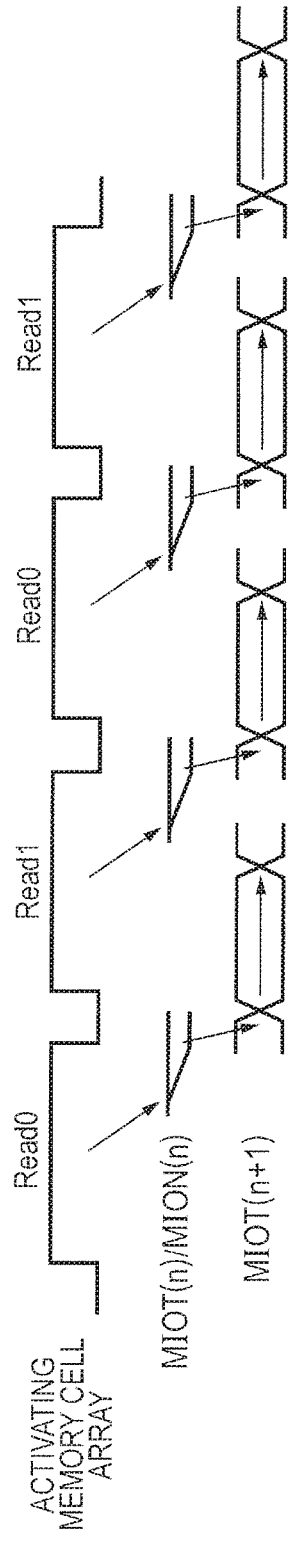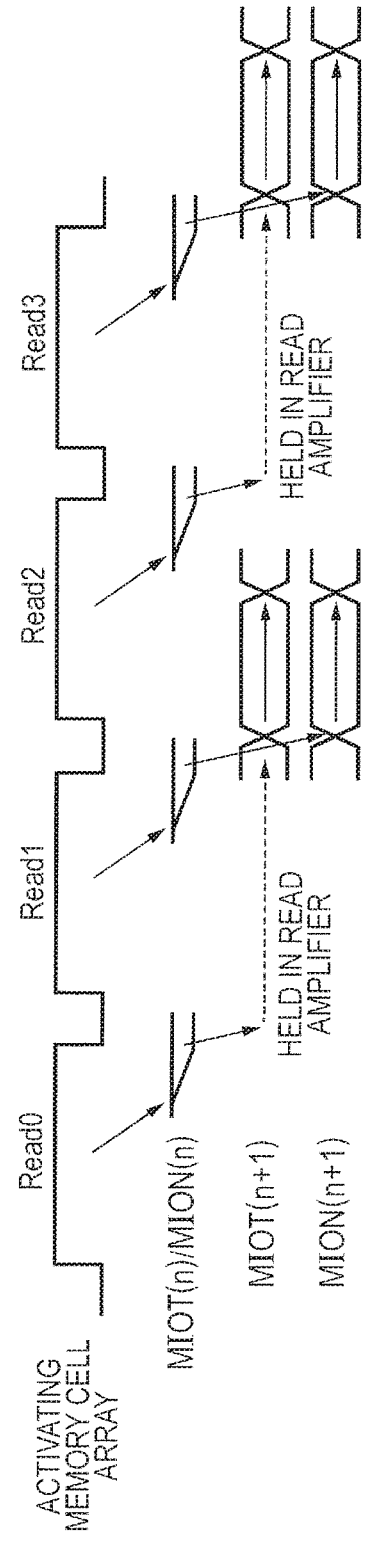

SEMICONDUCTOR DEVICE

CROSS-REFERENCE TO RELATED APPLICATIONS

The disclosure of Japanese Patent Application No. 2018-084187 filed on Apr. 25, 2018 including the specification, drawings and abstract is incorporated herein by reference in its entirety.

BACKGROUND

The present invention relates to a semiconductor device.

For memory cell arrays that are divided into multiple numbers, a hierarchy bus wiring for transmitting data has been known. For example, Patent Literature 1 discloses the following.

A column block CB #i includes eight sub-array blocks SBA0$i$-SBA7$i$. Four global I/O lines (pairs) GIOa-GIOd are arranged common to the sub-array blocks SBA0$i$-SBA7$i$. Four local I/O lines (pairs) LIOa, LIOb, LIOc, and LIOd are provided for each of the sub-array blocks SBA0$i$-SBA7$i$. The local I/O lines LIOa-LIOd perform transmit/receive of data only for the corresponding sub-array block. In one column block CB #i, one sub-array block is set into a selected state among the eight sub-array blocks SBA0$i$-SBA7$i$, and the selected sub-array block performs transmit/receive of data with the global I/O lines GIOa-GIOd via the local I/O lines LIOa-LIOd.

(Patent Literature 1) Japanese Unexamined Patent Application Publication No. 2007-184101

SUMMARY

However, in Patent Literature 1, it is necessary to provide the local I/O lines LIOa-LIOd for every sub-array block and to provide the global I/O lines GIOa-GIOd common to the sub-array block, requiring a large number of data wirings. Therefore, the problem is that the area occupied by the data wirings is large.

The other issues and new features of the present invention will become clear from the description of the present specification and the accompanying drawings.

In a semiconductor device according to one embodiment, in a selected memory cell array among multiple memory cell arrays, a data wiring functions as a local wiring to transmit data of the selected memory cell. Among the multiple memory cell arrays, in at least one memory cell array that is not selected and is located between a data circuit and the selected memory cell array, the data wiring functions as a global wiring to transmit data of a memory cell of the selected memory cell array.

According to the semiconductor device of one embodiment, the number of the data wirings is small and the area occupied by the data wirings is small.

BRIEF DESCRIPTION OF THE DRAWINGS

FIG. 1 is a drawing illustrating the configuration of a semiconductor device according to Embodiment 1;

FIG. 2 is a drawing illustrating a hierarchy bus wiring of Reference Example 1;

FIG. 15 is a drawing illustrating an operating waveform at the time of continuous read in the related art;

FIG. 16 is a drawing illustrating an operating waveform at the time of continuous read in Embodiment 5;

DETAILED DESCRIPTION

Hereinafter, each embodiment is explained with reference to drawings.

Embodiment 1

FIG. 1 illustrates the configuration of a semiconductor device according to Embodiment 1.

The semiconductor device includes multiple memory cell arrays M(0), M(1), M(2), and M(3), a data wiring MIO, and a data circuit 500.

Each of the memory cell arrays M(0), M(1), M(2), and M(3) includes multiple memory cells MC.

The data wiring MIO is arranged ranging over the memory cell arrays M(0)-M(3).

The data circuit 500 is coupled to one end of the data wiring MIO, outputs data to the wiring MIO, and receives data from the data wiring MIO.

In a selected memory cell array (for example, M(1)) among the memory cell arrays M(0)-M(3), the data wiring MIO functions as a local wiring that transmits data of a selected memory cell MC. The data wiring MIO provided in the memory cell arrays M(2) and M(3) that are not selected among the memory cell arrays M(0)-M(3) and that are located between the data circuit 500 and the selected memory cell array M(1) functions as a global wiring that transmits data of a memory cell MC of the selected memory cell array M(1).

According to Embodiment 1, the data wiring MIO functions as a local wiring and a global wiring. Therefore, it is possible to enlarge the bit width of data, suppressing the increase in the area of the semiconductor device.

Reference Example 1

FIG. 2 illustrates a hierarchy bus wiring of Reference Example 1. Through this hierarchy bus wiring, data is transferred to memory cell arrays that are divided into multiple numbers. The hierarchy bus wiring is arranged in an upper layer of the memory cell arrays by use of a metal wiring layer.

Figure 3:
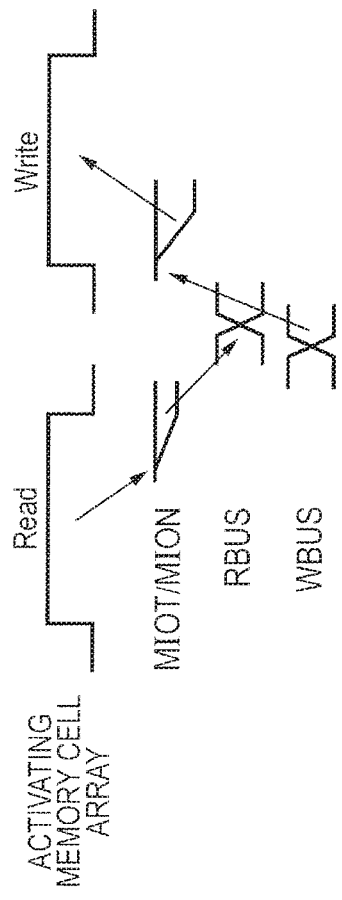
FIG. 3 is a drawing illustrating an operating waveform of the hierarchy bus wiring of Reference Example 1.

FIG. 3 illustrates an operating waveform of the hierarchy bus wiring of Reference Example 1. Data wirings MIOT(n) and MION(n) that are circuit-wise lower-order buses are arranged in a memory cell array M(n). The data wirings MIOT(n) and MION(n) are coupled to a main amplifier MP(n).

The data from a memory cell is sent to the main amplifier MP via a bit-line pair BL, a sense amplifier SA, data lines LIOT and LION, and a switch IOSW. Accordingly, the data will have a small amplitude. Therefore, the data from a memory cell is transmitted in differential format by use of a pair of data wirings MIOT(n) and MION(n).

The main amplifiers MP(0)-MP(3) are coupled to a read bus wiring RBUS and a write bus wiring WBUS as a global data wiring that is a circuit-wise higher-order bus. The read bus wiring RBUS and the write bus wiring WBUS are coupled to a data I/O circuit 91.

The main amplifier MP(n) amplifies differentially the differential read data from the memory cell MC up to a logic level at the time of read and amplifies a single-phase write data to generate differential data at the time of write. Therefore, the read bus wiring RBUS and the write bus wiring WBUS can be configured with single-phase signal lines.

In Reference Example 1, the wirings on the memory cell array that are required for transferring 1-bit data are data wirings MIOT and MION, a read bus wiring RBUS, a write bus wiring WBUS, and a shielding wiring SB to prevent a noise from superimposing on the data wirings MIOT and MION that carry a small amplitude signal. Therefore, the problem is that a large number of data wirings are required.

In Reference Example 1, in order to perform the multi-bit data processing, it is necessary to increase a metal wiring layer physically in the lamination direction, or to provide an exclusive area in which a read bus wiring RBUS and a write bus wiring WBUS as higher-order BUS wirings are arranged between the memory cell arrays. This results in the considerable area increase; accordingly, the bus architecture of Reference Example 1 is not suitable as the bus architecture of the multi-bit data processing.

Reference Example 2

Figure 4:
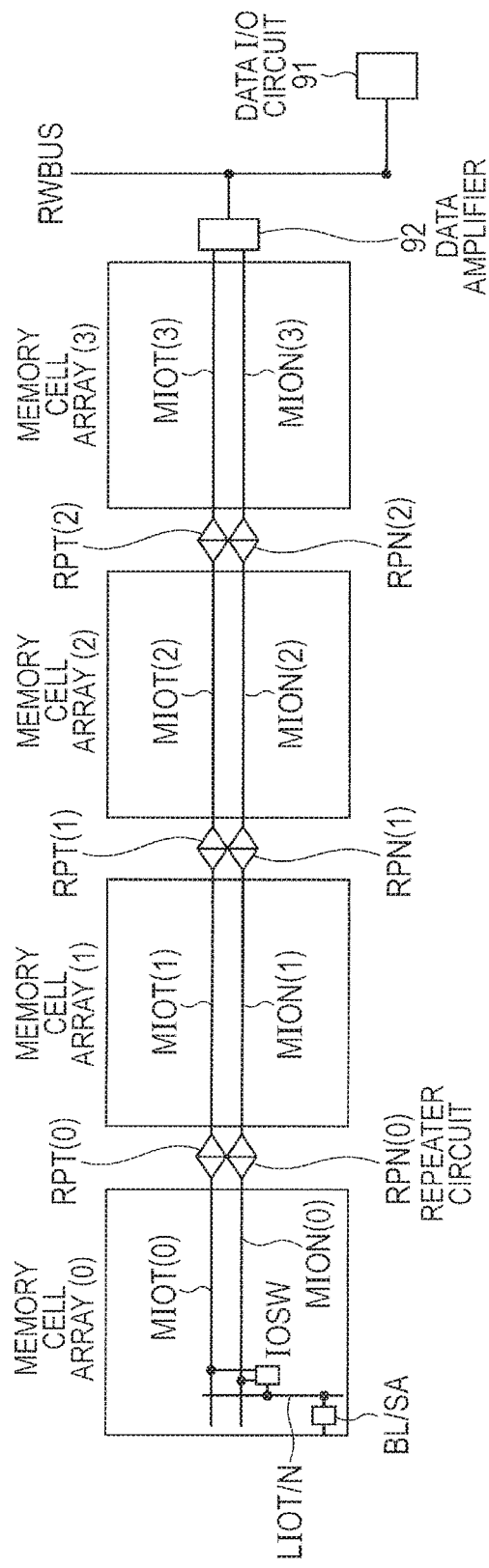
FIG. 4 is a drawing illustrating a hierarchy bus wiring of Reference Example 2.

FIG. 4 illustrates a hierarchy bus wiring of Reference Example 2.

In Reference Example 2, as is the case with Reference Example 1, data wirings MIOT(n) and MION(n) that transmit read data from a memory cell or write data to a memory cell in differential format are arranged in a memory cell array M(n).

The data wirings MIOT(n) and the MION(n) in the memory cell array M(n) are coupled to the data wirings MIOT(n+1) and MION(n+1) in the adjoining memory cell array M(n+1) via repeater circuits RPT(n) and RPN(n).

The repeater circuits RPT(n) and RPN(n) correspond to a switch IOSW from a sense amplifier SA with a low driving ability. The output of the repeater circuits RPT(n) and RPN(n) drives the following data wirings MIOT(n+1) and MION(n+1).

Data wirings MIOT(3) and MION(3) are coupled to a data amplifier 92. At the time of read, the data amplifier 92 performs differential amplification of the read data in differential format on the data wirings MIOT(3) and MION(3) up to the logic level. The output of the data amplifier 92 is sent to a data I/O circuit 91 via a data bus wiring RWBUS in a peripheral circuit area. At the time of write, the data amplifier 92 generates write data in differential format from logical-level write data sent from the data I/O circuit 91 via the data bus wiring RWBUS, and outputs the generated write date to the data wirings MIOT(3) and MION(3).

Figure 5:
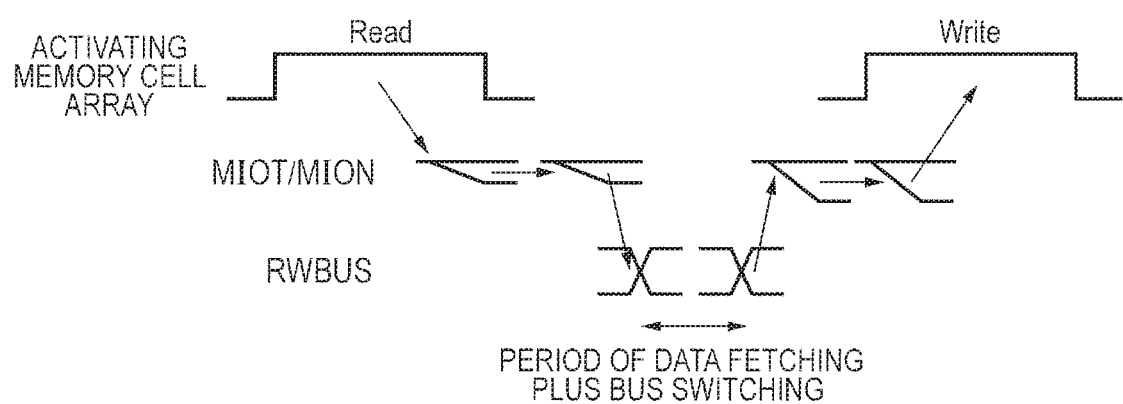
FIG. 5 is a drawing illustrating an operating waveform of the hierarchy bus wiring of Reference Example 2.

FIG. 5 illustrates an operating waveform of the hierarchy bus wiring of Reference Example 2.

As illustrated in FIG. 5, in Reference Example 2, the signal on the data wirings MIOT and MION is differential data of a low amplitude; accordingly, the problem is that the data transfer takes time.

As illustrated in FIG. 5, when write is performed in succession to read, after the read data on the data wirings MIOT(3) and MION(3) is acquired by the data amplifier 92, the write data is allowed to be outputted to the data wirings MIOT(3) and MION(3) from the data amplifier 92. As a result, the problem is that the change of read and write takes much time.

Embodiment 2

According to Embodiment 2, the data wiring arranged in each memory cell array is used also as a global wiring that transfers a signal across multiple memory arrays. In a selected memory cell array, the data wiring is used as a lower-order bus wiring (local wiring) for write of data to a memory cell or for read of data from a memory cell. In an un-selected memory cell array being located nearer to the data circuit than from the selected memory cell array, the data wiring is used as a higher-order BUS wiring (global wiring) that transmits the write data to the selected memory cell array or transmits the read data from the selected memory cell array to the data circuit.

Figure 6:
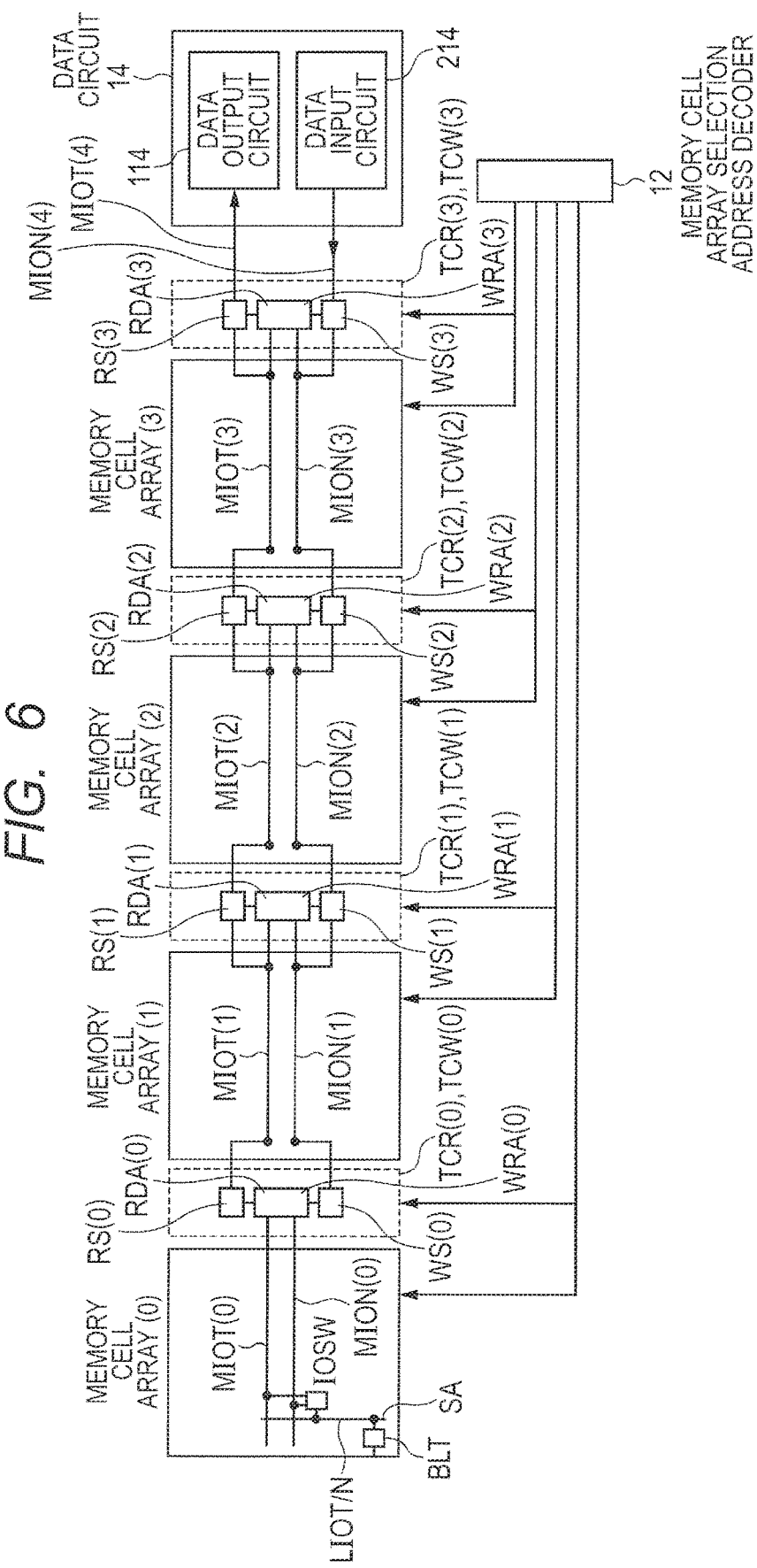
FIG. 6 is a drawing illustrating a semiconductor device according to Embodiment 2.

FIG. 6 illustrates a semiconductor device according to Embodiment 2.

The semiconductor device includes multiple memory cell arrays M(0)-M(3), a data circuit 14, a memory cell array selection address decoder 12, a first data wiring MIOT, and a second data wiring MION.

The data circuit 14 includes a data output circuit 114 and a data input circuit 214.

The data output circuit 114 and the data input circuit 214 are arranged in proximity to one end (right side) of an area where the memory cell arrays M(0)-M(3) are arranged.

The data output circuit 114 is coupled to one end (right side) of the first data wiring MIOT. The data input circuit 214 is coupled to one end (right side) of the second data wiring MION. The one end (right side) of the second data wiring MION is one of both ends of the second data wiring MION that is located near the one end (right side) of the first data wiring MIOT. The first data wiring MIOT and the second data wiring MION may be arranged in parallel.

The semiconductor device includes a first data transmission control circuit TCR(n) corresponding to the memory cell array M(n). The first data transmission control circuit TCR(n) is arranged in the position adjoining the corresponding memory cell array M(n) and nearer to the data output circuit 114 than from the corresponding memory cell array M(n). The first data transmission control circuit TCR(n) includes a read amplifier RDA(n) and a switching circuit RS(n).

The semiconductor device includes a second data transmission control circuit TCW(n) corresponding to the memory cell array M(n). The second data transmission control circuit TCW(n) is arranged in the position adjoining the corresponding memory cell array M(n) and nearer to the data input circuit 214 than from the corresponding memory cell array M(n). The second data transmission control circuit TCW(n) includes a write amplifier WRA(n) and a switching circuit WS(n).

It is assumed that the memory cell array M(n) with a larger n is located nearer to the data circuit 14.

The first data wiring MIOT and the second data wiring MION are divided by the first data transmission control circuits TCR(0)-TCR(3) and the second data transmission control circuits TCW(0)-TCW(3). In the memory cell array M(i), the first data wiring MIOT(i) and the second data wiring MION(i) are arranged, where i=0-3. The first data wiring MIOT(4) couples the data output circuit 114 to the first data transmission control circuit TCR(3). The second data wiring MION(4) couples the data input circuit 214 to the second data transmission control circuit TCW(3).

The memory cell array selection address decoder 12 selects and activates one of the memory cell arrays M(0)-M(3). At the time of read, the memory cell array selection address decoder 12 selects one of the first data transmission control circuits TCR(0)-TCR(3), outputs a selection switching control signal to the selected first data transmission control circuit TCR, and outputs a non-selection switching control signal to the un-selected first data transmission control circuit TCR. At the time of write, the memory cell array selection address decoder 12 selects one of the second data transmission control circuits TCW(0)-TCW(3), outputs a selection switching control signal to the selected second data transmission control circuit TCW, and outputs a non-selection switching control signal to the un-selected second data transmission control circuit TCW.

In the selected memory cell array M(n), a memory cell MC is selected by a bit line and a word line.

The selected memory cell MC is coupled to the first data wiring MIOT(n) and the second data wiring MION(n), via the bit-line pair BL, the sense amplifier SA, the data lines LIOT and LION, and the switch IOSW. The first data wiring MIOT(n) and the second data wiring MION(n) are driven by differential data.

The first data wiring MIOT(n) and the second data wiring MION(n) in the memory cell array M(n) are coupled to the read amplifier RDA(n) and the write amplifier WRA(n). The read amplifier RDA(n) amplifies the differential read data of a memory cell MC on the first data wiring MIOT(n) and the second data wiring MION(n). The write amplifier WRA(n) outputs differential write data to the first data wiring MIOT(n) and the second data wiring MION(n).

The switching circuit RS(n) is coupled to the first data wiring MIOT(n), the first data wiring MIOT(n+1), and the read amplifier RDA(n). The switching circuit WS(n) is coupled to the second data wiring MION(n), the second data wiring MION(n+1), and the write amplifier WRA(n), where n=0-3.

The first data wiring MIOT(4) is coupled to the data output circuit 114. The second data wiring MION(4) is coupled to the data input circuit 214.

In a selected memory cell array, the first data wiring MIOT and the second data wiring MION function as a local wiring that transmits the corresponding differential data to a circuit-wise lower-order bus. In at least one memory cell array that is not selected and is located between the data output circuit 114 and a selected memory cell array, the first data wiring MIOT functions as a read bus wiring that transmits the corresponding single-phase logical-level data to a circuit-wise higher-order bus.

In at least one memory cell array that is not selected and is located between the data input circuit 214 and a selected memory cell array, the second data wiring MION functions as a write bus wiring that transmits the corresponding single-phase logical-level data to a circuit-wise higher-order bus.

Figure 7:
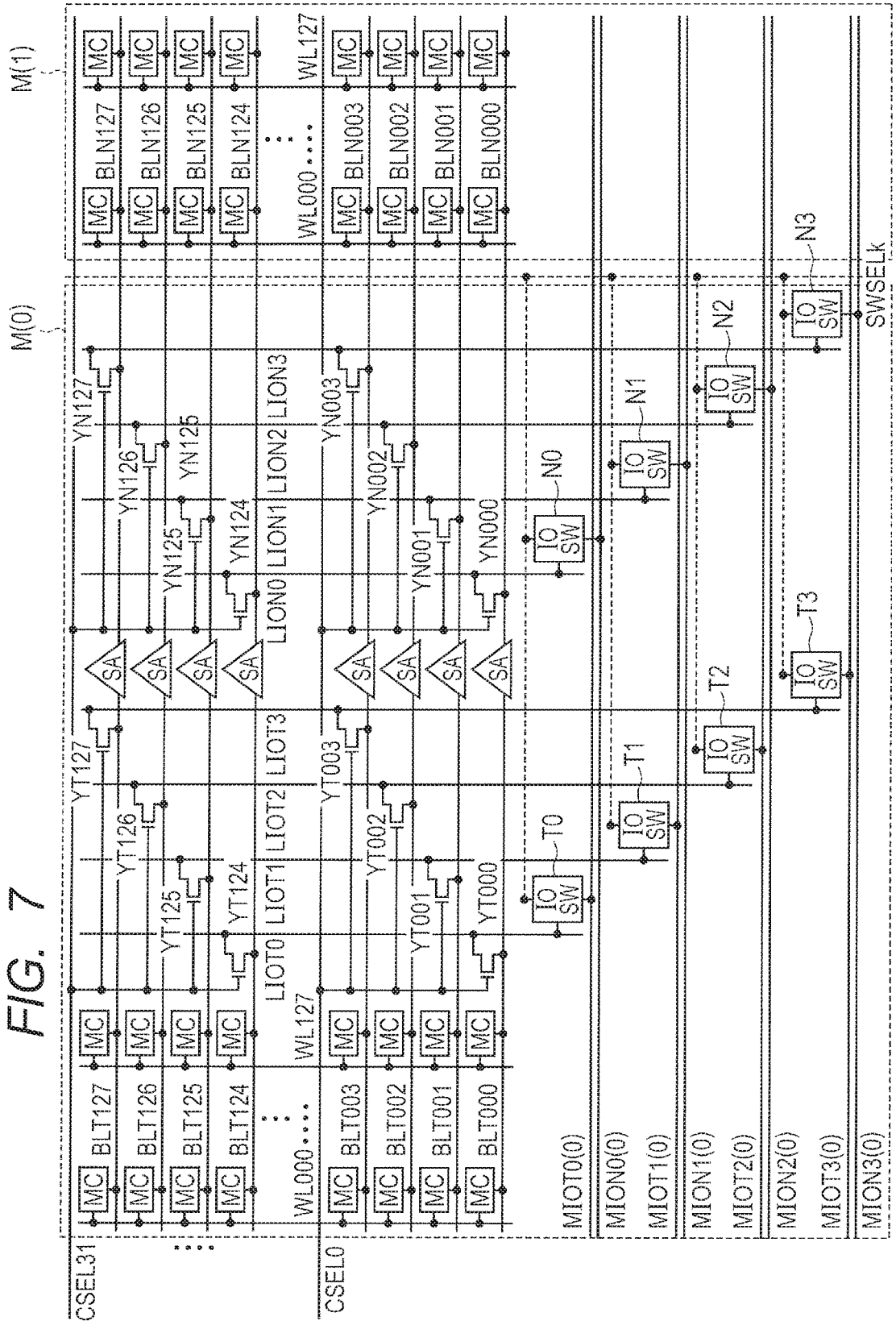
FIG. 7 is a drawing illustrating an example of the configuration of a memory cell array according to Embodiment 2.

FIG. 7 illustrates an example of the configuration of a memory cell array according to Embodiment 2.

As illustrated in FIG. 7, a memory cell array M(i) includes a plurality of memory cells MC arranged in a matrix. The memory cell array M(i) has 128 columns, and 128 bit lines BLT000-BLT127, and BLN000-BLN127. A bit-line pair configured with the bit line BLT of the memory cell array M(i) and the bit line BLN of the memory cell array M(i+1) adjoining the memory cell array M(i) are coupled to the sense amplifier SA. Four bit-line pairs BLT4$n$+s and BLN4$n$+s (s=0, 1, 2, 3) are selected by a column selection signal CSELn (n=0-31).

32 bit lines BLT4$n$ (n=0-31) are coupled to a data line LIOT0 via a column selection switch YT4$n$ (n=0-31) to which the column selection signal CSELn (n=0-31) is supplied. A bit line BLN4$n$ (n=0-31) pairing off with the bit line BLT4$n$ is coupled to the data line LION0 via a column selection switch YN4$n$ (n=0-31) to which the column selection signal CSELn (n=0-31) is supplied. In the same manner, 32 bit lines BLT4$n$+1 (n=0-31) are coupled to a data line LIOT1 via a column selection switch YT4$n$+1 (n=0-31) to which the column selection signal CSELn (n=0-31) is supplied. A bit line BLN4$n$+1 (n=0-31) pairing off with the bit line BLT4$n$+1 is coupled to the data line LION1 via a column selection switch YN4$n$+1 (n=0-31) to which the column selection signal CSELn (n=0-31) is supplied. 32 bit lines BLT4$n$+2 (n=0-31) are coupled to a data line LIOT2 via a column selection switch YT4$n$+2 (n=0-31) to which the column selection signal CSELn (n=0-31) is supplied. A bit line BLN4n+2 (n=0-31) pairing off with the bit line BLT4n+2 is coupled to the data line LION2 via a column selection switch YN4n+2 (n=0-31) to which the column selection signal CSELn (n=0-31) is supplied. 32 bit lines BLT4n+3 (n=0-31) are coupled to a data line LIOT3 via a column selection switch YT4n+3 (n=0-31) to which the column selection signal CSELn (n=0-31) is supplied. A bit line BLN4n+3 (n=0-31) pairing off with the bit line BLT4n+3 is coupled to the data line LION3 via a column selection switch YN4n+3 (n=0-31) to which the column selection signal CSELn (n=0-31) is supplied.

The column selection switch YT/YN may be configured with an N channel transistor coupled between the bit line BLT/BLN and the data line LIOT/LION, as illustrated in FIG. 7.

A data line LIOTk (k=0-3) is coupled to a first data wiring MIOTk(i) via a switch IOSWTk. A data line LIONk (k=0-3) is coupled to a second data wiring MIONk(i) via a switch IOSWNk. The switches IOSWTk and IOSWNk are selected by a switch selection signal SWSELk. The switches IOSWTk and IOSWNk may have the same configuration as the column selection switch.

In the configuration of the memory cell array illustrated in FIG. 7, four first data wirings MIOT0(0)-MIOT3(0) and four second data wirings MION0(0)-MION3(0) are arranged in the area of a memory cell array M(0). Consequently, four sets of the first data transmission control circuit TCR and the second data transmission control circuit TCW illustrated in FIG. 6 are required for one memory cell array.

Figure 8:
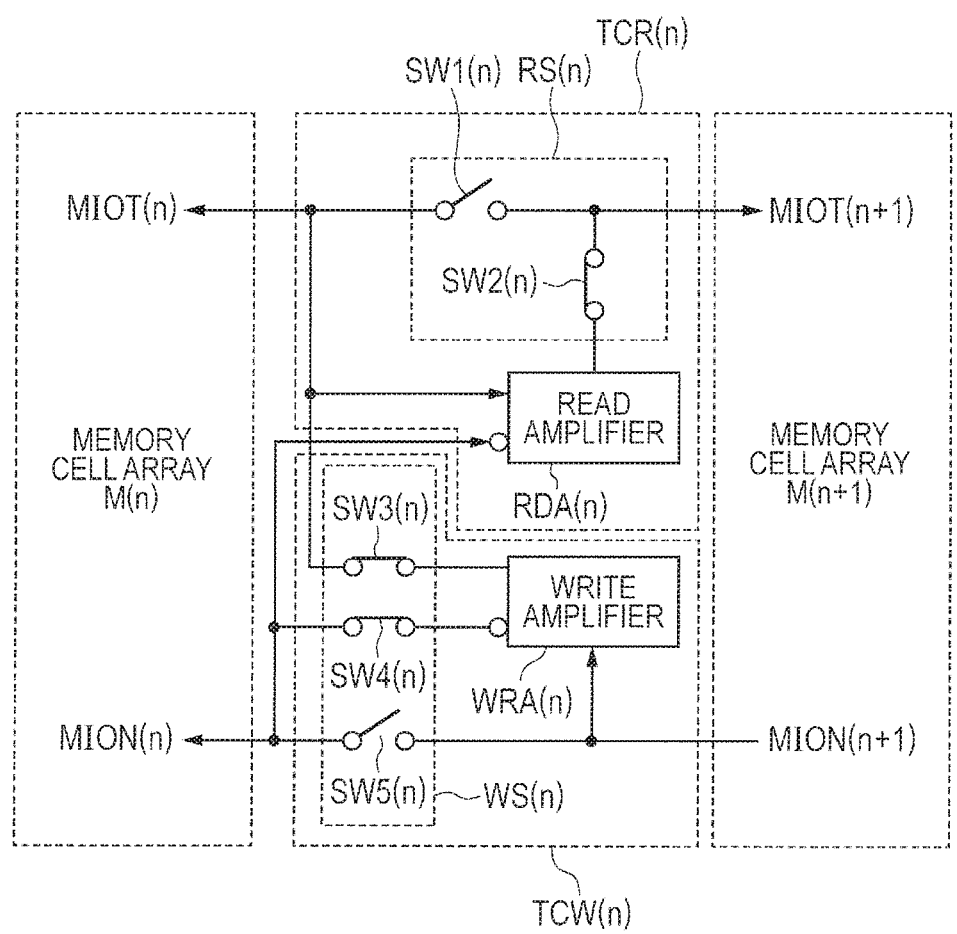
FIG. 8 is an explanatory drawing illustrating operation of a first data transmission control circuit TCR(n) and a second data transmission control circuit TCW(n) for a selected memory cell array M(n)

FIG. 8 is an explanatory drawing illustrating operation of the first data transmission control circuit TCR(n) and the second data transmission control circuit TCW(n) for the selected memory cell array M(n).

The case of a read operation is explained.

The read amplifier RDA(n) amplifies differentially the differential read data from a selected memory cell MC transmitted via the first data wiring MIOT(n) and the second data wiring MION(n) in the memory cell array M(n), and generates single-phase read data.

In the switching circuit RS(n), a switch SW1(n) is set to OFF and a switch SW2(n) is set to ON. In the switching circuit WS(n), a switch SW3(n), a switch SW4(n), and a switch SW5(n) are set to OFF. As a result, the output of the read amplifier RDA(n) is coupled to the first data wiring MIOT(n+1) that is coupled to the first data transmission control circuit TCR(n) and is located near to the data output circuit 114. According to this setting, the single-phase read data outputted from the read amplifier RDA(n) is transmitted to the first data wiring MIOT(n+1).

The case of a write operation is explained.

The write amplifier WRA(n) is coupled to the second data transmission control circuit TCW(n), and generates differential write data based on the single-phase write data transmitted through the second data wiring MION(n+1) that is located nearer to the data input circuit 214.

In the switching circuit WS(n), the switch SW3(n) and the switch SW4(n) are set to ON, and the switch SW5(n) is set to OFF. In the switching circuit RS(n), the switch SW1(n) and the switch SW2(n) are set to OFF. According to this setting, the output of the write amplifier WRA(n) is coupled to the first data wiring MIOT(n) and the second data wiring MION(n) in the memory cell array M(n). The positive phase of the differential write data outputted from the write amplifier WRA(n) is transmitted to the first data wiring MIOT(n) in the memory cell array M(n), and the negative phase of the differential write data outputted from the write amplifier WRA(n) is transmitted to the second data wiring MION(n) in the memory cell array M(n).

Figure 9:
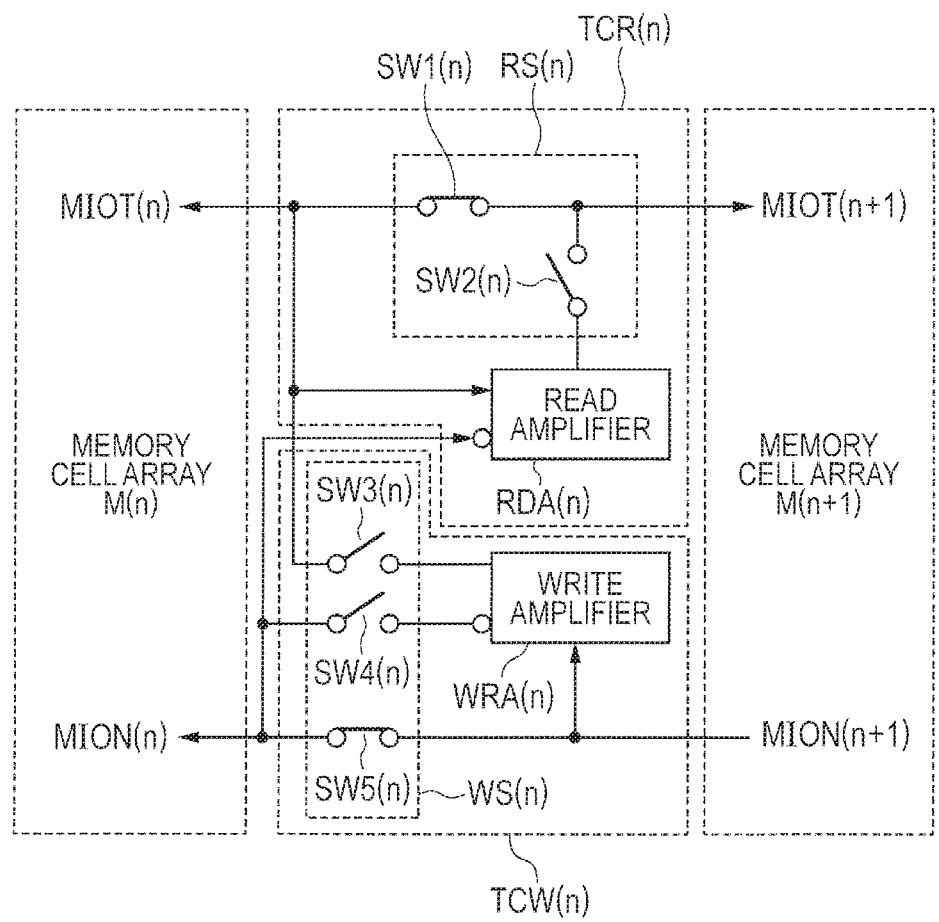
FIG. 9 is an explanatory drawing illustrating operation of the first data transmission control circuit TCR(n) and the second data transmission control circuit TCW(n) for an un-selected repeater memory cell array M(n)

FIG. 9 is an explanatory drawing illustrating operation of the first data transmission control circuit TCR(n) and the second data transmission control circuit TCW(n) for an un-selected repeater memory cell array M(n). The un-selected repeater memory cell array M(n) is a memory cell array that is not selected and is located between the data circuit 14 and the selected memory cell array.

The case of a read operation is explained.

In the switching circuit RS(n), the switch SW1(n) is set to ON and the switch SW2(n) is set to OFF. In the switching circuit WS(n), the switch SW3(n), the switch SW4(n), and the switch SW5(n) are set to OFF. As a result, the first data wiring MIOT(n) in the un-selected repeater memory cell array M(n) is coupled to the first data wiring MIOT(n+1) that is coupled to the first data transmission control circuit TCR(n) and is located nearer the data output circuit 114. According to this setting, the single-phase read data that is transmitted via the first data wiring MIOT(n) in the memory cell array M(n) is transmitted to the first data wiring MIOT(n+1).

The case of a write operation is explained.

In the switching circuit WS(n), the switch SW3(n) and the switch SW4(n) are set to OFF and the switch SW5(n) is set to ON. In the switching circuit RS(n), the switch SW1(n) and the switch SW2(n) are set to OFF. As a result, the second data wiring MION(n+1) that is coupled to the second data transmission control circuit TCW(n) and is located nearer to the data input circuit 214 is coupled to the second data wiring MION(n) in the un-selected repeater memory cell array M(n). According to this setting, the single-phase write data that is transmitted via the second data wiring MION(n+1) is transmitted to the second data wiring MION(n) in the memory cell array M(n).

The operation in Embodiment 2 is explained with reference to FIG. 6, FIG. 8, and FIG. 9.

First, the operation in read is explained.

The memory cell array selection address decoder 12 selects one memory cell array from the memory cell arrays M(0)-M(3). It is assumed that the memory cell array M(1) is selected.

A memory cell is selected from multiple memory cells included in the selected memory cell array M(1), according to the address. The data held in the selected memory cell is sent to the first data wiring MIOT(1) and the second data wiring MION(1) in the form of a differential signal via the bit-line pair BLT, the sense amplifier SA, the data lines LIOT and LION, and the switch IOSW.

The read amplifier RDA(1) amplifies the differential read data transmitted via the first data wiring MIOT(1) and the second data wiring MION(1) up to a logical level, and outputs the single-phase logical-level read data having a high driving ability. In the switching circuit RS(1), the switch SW1(1) is set to OFF and the switch SW2(1) are set to ON. In the switching circuit WS(1), the switch SW3(1), the switch SW4(1), and the switch SW5(1) are set to OFF. The single-phase logical-level read data outputted from the read amplifier RDA(1) is transmitted to the first data wiring MIOT(2) in the memory cell array M(2). In the switching circuit RS(2), the switch SW1(2) is set to ON and the switch SW2(2) is set to OFF. The single-phase logical-level read data that is transmitted via the first data wiring MIOT(2) is transmitted to the first data wiring MIOT(3). In the switching circuit WS(2), the switch SW3(2), the switch SW4(2), and the switch SW5(2) are set to OFF.

In the switching circuit RS(3), the switch SW1(3) is set to ON and the switch SW2(3) is set to OFF. The single-phase logical-level read data that is transmitted via the first data wiring MIOT(3) is transmitted to the first data wiring MIOT(4) coupled to the data output circuit 114. In the switching circuit WS(3), the switch SW3(3), the switch SW4(3), and the switch SW5(3) are set to OFF.

On the other hand, in the switching circuit WS(0), the switch SW3(0), the switch SW4(0), and the switch SW5(0) are set to OFF, and in the switching circuit RS(0), the switch SW1(0) is set to ON and the switch SW2(2) is set to OFF. The switch SW1(0) may be set to OFF. According to this setting, it is possible to prevent noises of the data wirings MIOT(0) and MION(0) from being transmitted to the first data wirings MIOT(1) and the second data wiring MION(1).

Next, the operation in write is explained.

The memory cell array selection address decoder 12 selects one memory cell array from the memory cell arrays M(0)-M(3). It is assumed that the memory cell array M(1) is selected.

A memory cell is selected from multiple memory cells included in the selected memory cell array M(1), according to the address.

The data input circuit 214 outputs single-phase logical-level write data to the second data wiring MION(4). In the switching circuit WS(3), the switch SW5(3) is set to ON, and the switch SW3(3) and the switch SW4(3) are set to OFF. In the switching circuit RS(3), the switch SW1(3) and the switch SW2(3) are set to OFF. The single-phase logical-level write data that is transmitted via the second data wiring MION(4) is transmitted to the second data wiring MION(3).

In the switching circuit WS(2), the switch SW5(2) is set to ON, and the switch SW3(2) and the switch SW4(2) are set to OFF. In the switching circuit RS(2), the switch SW1(2) and the switch SW2(2) are set to OFF. The single-phase logical-level write data that is transmitted via the second data wiring MION(3) is transmitted to the second data wiring MION(2).

The write amplifier WRA(1) generates a differential write data based on the single-phase logical-level write data transmitted via the second data wiring MION(2). In the switching circuit WS(1), the switch SW5(1) is set to OFF, and the switch SW3(1) and the switch SW4(1) are set to ON. In the switching circuit RS(1), the switch SW1(1) and the switch SW2(1) are set to OFF. The differential write data is transmitted to the first data wiring MIOT(1) and the second data wiring MION(1). The differential write data that is transmitted along the first data wiring MIOT(1) and the second data wiring MION(1) is written in the selected memory cell via the switch IOSW, the data lines LIOT and LION, and the bit-line pair BLT.

On the other hand, in the switching circuit RS(0), the switch SW1(0) and the switch SW2(0) are set to OFF. In the switching circuit WS(0), the switch SW5(0) is set to ON, and the switch SW3(0) and switch SW4(0) are set to OFF. The switch SW5(0) may be set to OFF. By setting the switch SW5(0) to OFF, it is possible to prevent the differential write data transmitted via the first data wiring MIOT(1) and the second data wiring MION(1) from being transmitted to the first data wiring MIOT(0) and the second data wiring MION(0).

Figure 10:
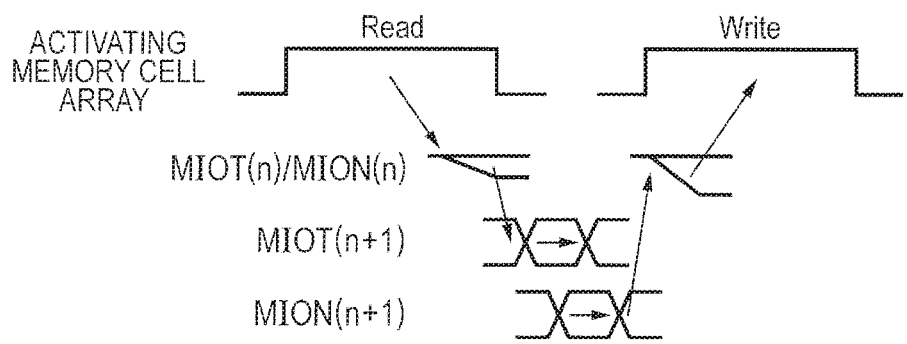
FIG. 10 is a timing chart in changing a read operation and a write operation in Embodiment 2.

FIG. 10 is a timing chart in changing a read operation and a write operation in Embodiment 2.

At the case of a read operation, the data read from the selected memory cell included in the selected memory cell array M(n) is transferred to the first data wiring MIOT(n) and the second data wiring MION(n) that extend over the area of the selected memory cell array M(n). At this time, the signal propagating on the first data wiring MIOT(n) and the second data wiring MION(n) has an amplitude as low as 0.1-0.3 V, for example. The read amplifier RDA(n) drives the data wiring MIOT(n+1) based on the read data transmitted via these data wirings MIOT(n) and MION(n). The signal amplitude on the data wiring MIOT(n+1) is 1.0-1.2 V, for example.

At the case of a write operation, differential write data is generated by the write amplifier WRA(n) based on the write data supplied via the second data wiring MION(n+1). This differential write data is written in the selected memory cell via the first data wiring MIOT(n) and the second data wiring MION(n) that extend over the area of the selected memory cell array M(n).

In this way, the first data wiring MIOT and the second data wiring MION are separated. Therefore, as illustrated in FIG. 10, when the read amplifier RDA(n) begins to output read data to the first data wiring MIOT(n+1) in read, it is possible to transmit write data of the next cycle to the first data wiring MION(n+1). Accordingly, it is possible to realize a high-speed cycle.

As described above, in Embodiment 2, by utilizing the wiring in an un-selected memory cell array as a circuit-wise higher-order bus, it is possible to realize the hierarchy bus wiring architecture that maintains high speed performance only with two wirings (MIOT, MION) per data. Accordingly, it is possible to support the configuration of multi bit data, and it is possible to realize the memory of high processing capacity at a low cost.

In Embodiment 2, a higher-order bus wiring signal of a logical signal level with an amplified voltage does not exist in the selected memory cell array. Therefore, there is no influence of noise from this bus wiring to the adjacent wire, and it is also possible to reduce the influence of noise on the memory cell array that is a physically lower layer. As a result, it is possible to secure the stable yield and operation margin.

In Embodiment 2, it is not necessary to provide a shielding wiring between a higher-order hierarchy bus and a lower-order hierarchy bus as compared with Reference Example 1. Therefore, it is possible to reduce the area for providing the shielding wiring.

Embodiment 3

Figure 11:
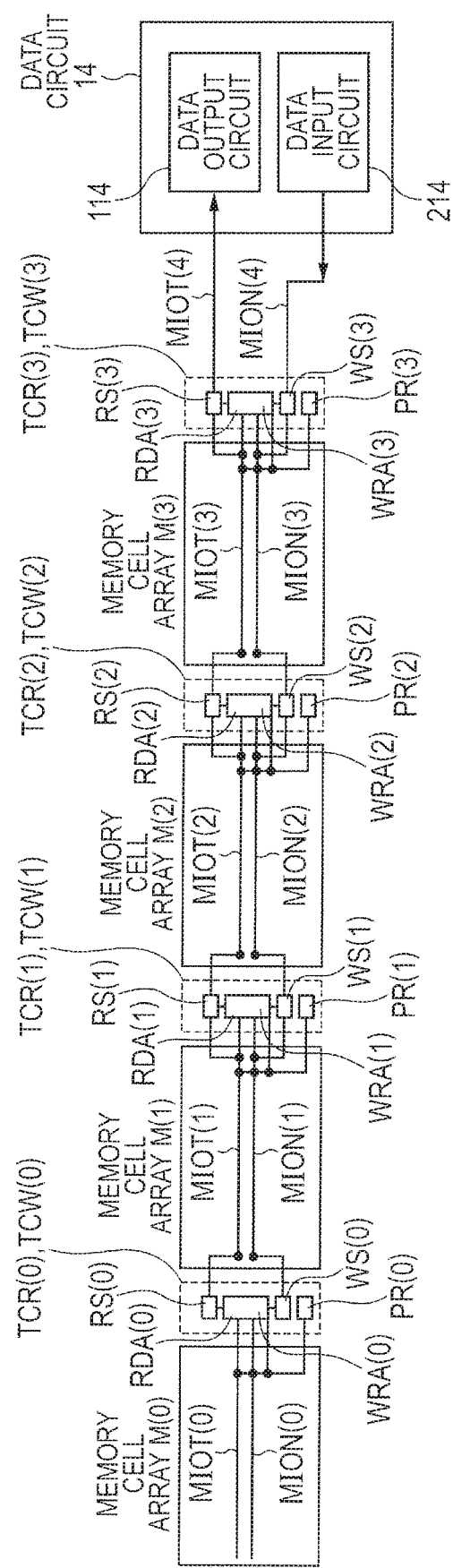
FIG. 11 is a drawing illustrating the configuration of a semiconductor device according to Embodiment 3.

FIG. 11 illustrates the configuration of a semiconductor device according to Embodiment 3.

The semiconductor device according to Embodiment 3 is different from the semiconductor device according to Embodiment 2 in that a switching circuit PR(n) is provided corresponding to the memory cell array M(n). The switching circuit PR(n) is arranged in the position adjoining the corresponding memory cell array M(n) and nearer to the data circuit 14 than from the memory cell array M(n).

Figure 12:
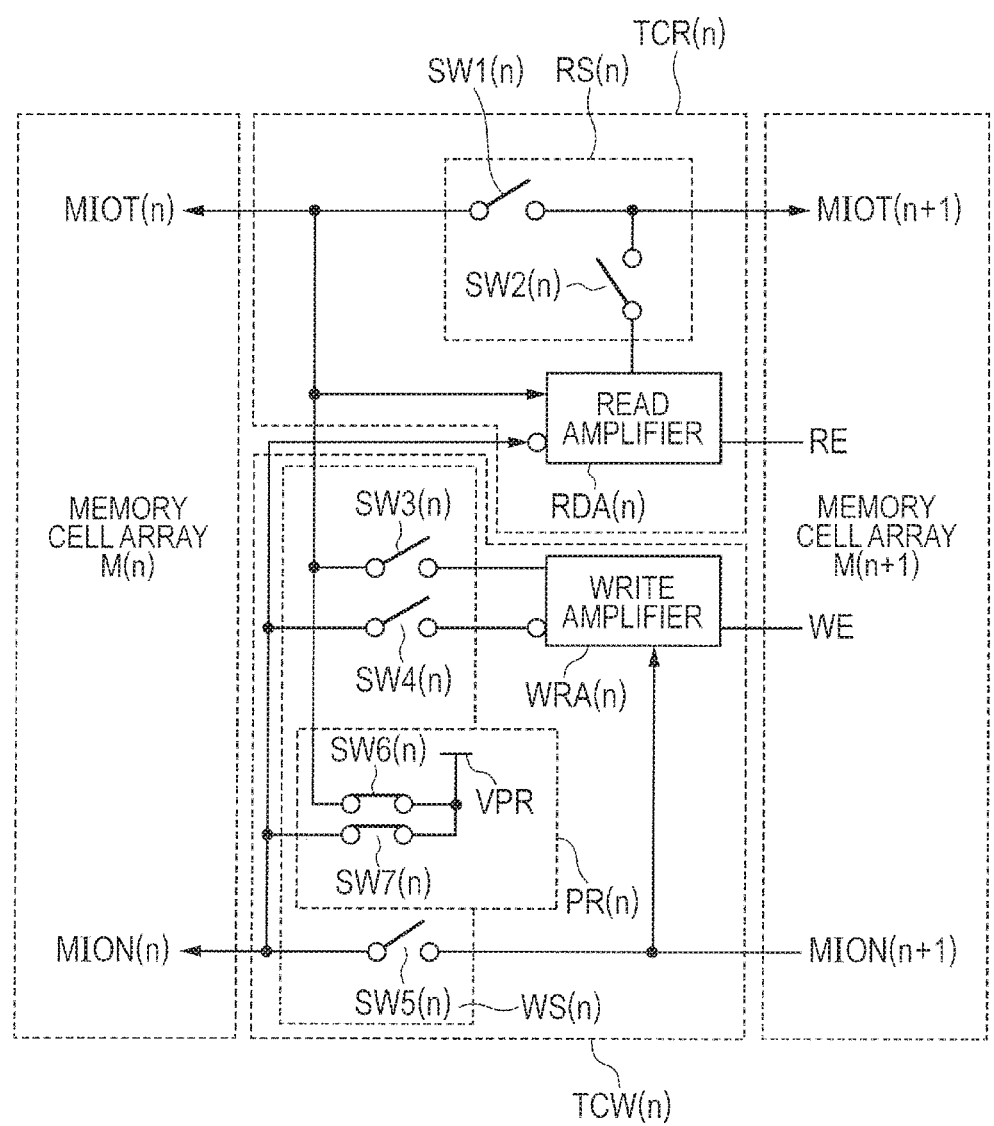
FIG. 12 is an explanatory drawing illustrating operation of the first data transmission control circuit TCR(n), the second data transmission control circuit TCW(n), and a switching circuit PR(n) for an un-selected non-repeater memory cell array M(n)

FIG. 12 is an explanatory drawing illustrating operation of the first data transmission control circuit TCR(n), the second data transmission control circuit TCW(n), and the switching circuit PR(n) for an un-selected non-repeater memory cell array M(n). The un-selected non-repeater memory cell array is an un-selected memory cell array arranged in the position more distant from the data output circuit 114 or the data input circuit 214 than the selected memory cell array.

The switching circuit PR(n) includes a switch SW6(*n*) and a switch SW7(*n*). The switch SW6(*n*) couples or decouples the first data wiring MIOT(n) to or from the power supply of a fixed voltage VPR. The switch SW7(n) couples or decouples the second data wiring MION(n) to or from the power supply of the fixed voltage VPR.

The case of a read operation is explained.

In the switching circuit RS(n) for the un-selected non-repeater memory cell array M(n) arranged in the position more distant from the data output circuit 114 than the selected memory cell array, the switch SW1(n) and the switch SW2(n) are set to OFF. In the switching circuit WS(n), the switch SW3(n), the switch SW4(n), and the switch SW5(n) are set to OFF. In the switching circuit PR(n), the switch SW6(n) and the switch SW7(n) are set to ON. According to this setting, the first data wiring MIOT(n) and the second data wiring MION(n) in the memory cell array M(n) are set to the fixed voltage VPR. Here, the fixed voltage VPR can be set as a voltage that enables a high speed operation for a subsequent read operation or write operation. For example, the fixed voltage VPR may be set as one half of the power supply voltage VDD. According to this setting, it is possible to prevent the first data wiring MIOT(n) and the second data wiring MION(n) from becoming a noise source, in spite of not being used for data communications. At the same time, it is possible to reduce the useless current consumption by driving the first data wiring MIOT(n) and the second data wiring MION(n).

The operation of the first data transmission control circuit TCR and the second data transmission control circuit TCW for the selected memory cell array, and the operation of the first data transmission control circuit TCR and the second data transmission control circuit TCW for the un-selected repeater memory cell array that is not selected and is located between the data output circuit 114 and the selected memory cell array, are the same as that of Embodiment 2.

In the switching circuit PR corresponding to the selected memory cell array, the switch SW6 and the switch SW7 are set to OFF. In the switching circuit PR corresponding to the un-selected repeater memory cell array that is not selected and is located between the data output circuit 114 and the selected memory cell array, the switch SW6 and the switch SW7 are set to OFF.

The case of a write operation is explained.

In the switching circuit RS(n) for the un-selected non-repeater memory cell array M(n) arranged in the position more distant from the data input circuit 214 than the selected memory cell array, the switch SW1(n) and the switch SW2(n) are set to OFF. In the switching circuit WS(n), the switch SW3(n), the switch SW4(n), and the switch SW5(n) are set to OFF. In the switching circuit PR(n), the switch SW6(n) and the switch SW7(n) are set to ON. According to this setting, the first data wiring MIOT(n) and the second data wiring MION(n) in the memory cell array M(n) are set to the fixed voltage VPR.

The operation of the first data transmission control circuit TCR and the second data transmission control circuit TCW for the selected memory cell array, and the operation of the first data transmission control circuit TCR and the second data transmission control circuit TCW for the un-selected repeater memory cell array that is not selected and is located between the data input circuit 214 and the selected memory cell array, are the same as that of Embodiment 2.

In the switching circuit PR for the selected memory cell array, the switch SW6 and the switch SW7 are set to OFF. In the switching circuit PR for the un-selected repeater memory cell array that is not selected and is located between the data input circuit 214 and the selected memory cell array, the switch SW6 and the switch SW7 are set to OFF.

In Embodiment 3, it is possible to set at a fixed voltage the data wiring that is located in the position more distant from the data circuit than the selected memory cell array and that is not used for the data communications. According to this setting, it is possible to reduce the current consumption and to expand the operation margin owing to the noise reduction.

Embodiment 4

In Embodiment 4, the data wiring that functions as a global wiring as a circuit-wise higher-order bus is assumed to be a common data wiring.

Figure 13:
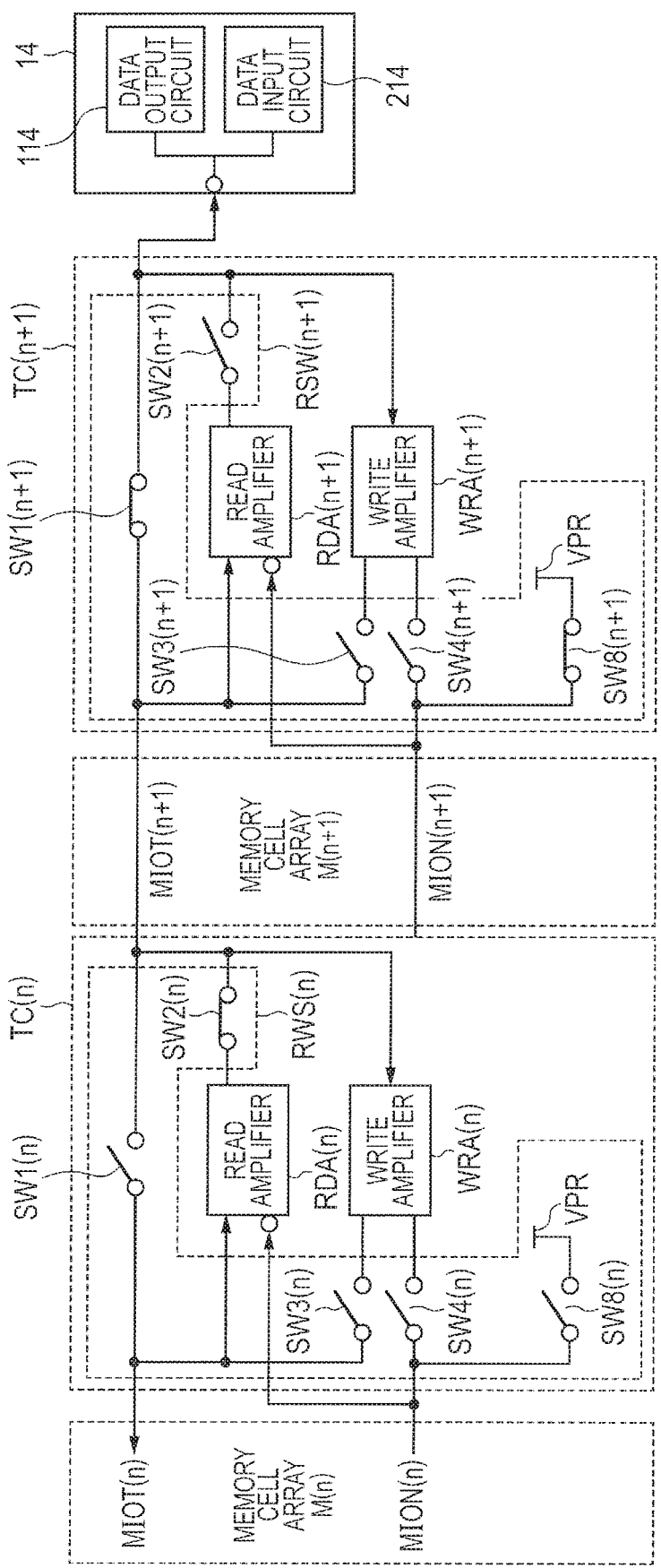
FIG. 13 is a drawing illustrating the configuration of a semiconductor device according to Embodiment 4.

FIG. 13 illustrates the configuration of a semiconductor device according to Embodiment 4.

The data circuit 14 includes a data output circuit 114 and a data input circuit 214.

The data output circuit 114 and the data input circuit 214 are arranged near one end of an area where the memory cell arrays M(0)-M(3) are arranged.

The data output circuit 114 and the data input circuit 214 are coupled to one end of the first data wiring MIOT.

The semiconductor device includes a data transmission control circuit TC(n) corresponding to the memory cell array M(n). The data transmission control circuit TC(n) is arranged in the position adjoining the corresponding memory cell array M(n) and nearer to the data circuit 14 than from the memory cell array M(n).

The data transmission control circuit TC(n) includes a read amplifier RDA(n), a write amplifier WRA(n), and a switching circuit RWS(n).

The first data wiring MIOT and the second data wiring MION are divided by the data transmission control circuits TC(0)-TC(3).

One of the memory cell arrays M(0)-M(3) is selected and activated by a memory cell array selection address decoder 12. In the case of read and write, the memory cell array selection address decoder 12 selects one of the data transmission control circuits TC(0)-TC(3), outputs a selection switching control signal to the selected data transmission control circuit, and outputs a non-selection switching control signal to the un-selected data transmission control circuit.

In the selected memory cell array, a memory cell is selected by a bit line and a word line.

The first data wiring MIOT(n) and the second data wiring MION(n) in the memory cell array M(n) are coupled to the read amplifier RDA(n) and the write amplifier WRA(n). The read amplifier RDA(n) amplifies the differential read data of the memory cell MC on the first data wiring MIOT(n) and the second data wiring MION(n). The write amplifier WRA(n) outputs the differential write data to the first data wiring MIOT(n) and the second data wiring MION(n).

The switching circuit RWS(n) includes a switch SW1(n), a switch SW2(n), a switch SW3(n), a switch SW4(n), and a switch SW8(n). The switch SW8(n) is coupled to the power supply of a fixed voltage VPR.

In a selected memory cell array, the first data wiring MIOT and the second data wiring MION function as a local wiring that transmits the corresponding differential data to a circuit-wise lower-order bus. In at least one memory cell array that is not selected and is located between the data circuit 14 and the selected memory cell array, the first data wiring MIOT functions as the read bus wiring and the write bus wiring that transmits the corresponding single-phase logical-level data to a circuit-wise higher-order bus. In at least one memory cell array that is not selected and is located between the data circuit 14 and the selected memory cell array, the second data wiring MION functions as a shielding wiring.

The memory cell array selection address decoder 12 selects one memory cell array from the memory cell arrays M(0)-M(3). In the following, it is assumed that the memory cell array M(n) is selected.

A memory cell is selected from multiple memory cells included in the selected memory cell array M(n), according to the address.

First, the operation in read is explained.

Data held in the selected memory cell in the memory cell array M(n) is transmitted to the first data wiring MIOT(n) and the second data wiring MION(n) in differential format, via the bit-line pair BLT, the sense amplifier SA, the data lines LIOT and LION, and the switch IOSW.

The read amplifier RDA(n) amplifies the differential read data transmitted via the first data wiring MIOT(n) and the second data wiring MION(n) up to a logical level, and outputs the single-phase logical-level read data having a high driving ability. In the switching circuit RWS(n), the switch SW2(n) is set to ON, and the switch SW1(n), the switch SW3(n), the switch SW4(n), and the switch SW8(n) are set to OFF. As a result, the output of the read amplifier RDA(n) is coupled to the first data wiring MIOT(n+1) that is coupled to the data transmission control circuit TC(n) and is located nearer the data output circuit 114. According to this setting, the single-phase logical-level read data outputted from the read amplifier RDA(n) is transmitted to the first data wiring MIOT(n+1).

In the switching circuit RWS(n+1) of the data transmission control circuit TC(n+1) corresponding to the un-selected repeater memory cell array M(n+1) that is not selected and is located between the data circuit 14 and the selected memory cell array M(n), the SW1(n+1) is set to ON, and the switch SW2(n+1), the switch SW3(n+1), and the switch SW4(n+1) are set to OFF. As a result, the first data wiring MIOT(n+1) in the un-selected repeater memory cell array M(n+1) is coupled to the first data wiring MIOT(n+2) that is coupled to the data transmission control circuit TC(n+1) and is located nearer the data output circuit 114. According to this setting, the single-phase logical-level read data on the first data wiring MIOT(n+1) is transmitted to the first data wiring MIOT(n+2).

Furthermore, the switch SW8(n+1) is set to ON. According to this setting, the second data wiring MION(n+1) in the un-selected repeater memory cell array M(n+1) is coupled to the power supply that outputs a fixed voltage VPR.

Next, the case of a write operation is explained.

The data input circuit 214 outputs a single-phase write data to the first data wiring MIOT(4).

In the switching circuit RWS(n+1) of the data transmission control circuit TC(n+1) corresponding to the un-selected repeater memory cell array M(n+1), the switch SW1(n+1) is set to ON, and the switch SW2(n+1), the switch SW3(n+1), and the switch SW4(n+1) are set to OFF. As a result, the first data wiring MIOT(n+2) that is coupled to the data transmission control circuit TC(n+1) and is located nearer the data input circuit 214 is coupled to the first data wiring MIOT(n+1) in the un-selected repeater memory cell array M(n+1). According to this setting, the single-phase write data that is transmitted via the first data wiring MIOT(n+2) is transmitted to the first data wiring MIOT(n+1) in the memory cell array M(n+1). Furthermore, the switch SW8(n+1) is set to ON. According to this setting, the second data wiring MION(n+1) in the un-selected repeater memory cell array M(n+1) is coupled to the power supply that outputs the fixed voltage VPR.

The write amplifier WRA(n) of the data transmission control circuit TC(n) corresponding to the selected memory cell array M(n) is coupled to the data transmission control circuit TC(n), and generates the write data in differential format, based on the single-phase write data transmitted via the first data wiring MIOT(n+1) that is located nearer the data input circuit 214. In the switching circuit RWS(n), the switch SW1(n) and the switch SW2(n) are set to OFF, and the switch SW3(n) and the switch SW4(n) are set to ON. As a result, the output of the write amplifier WRA(n) is coupled to the first data wiring MIOT(n) and the second data wiring MION(n) in the memory cell array M(n). According to this setting, the positive phase of the differential write data outputted from the write amplifier WRA(n) is transmitted to the first data wiring MIOT(n) in the memory cell array M(n), and the negative phase of the differential write data outputted from the write amplifier WRA(n) is transmitted to the second data wiring MION(n) in the memory cell array M(n).

In Embodiment 4, only the first data wiring MIOT is used as the global bus wiring in the un-selected memory cell array; accordingly, it is possible to utilize the second data wiring MION as a shielding wiring having a fixed voltage. Accordingly, the coupling noise between adjoining global bus wirings can be removed. Therefore, it is possible to improve the variations (data skew width) depending on the phase states among data signals and it is possible to realize the speeding-up of the data transfer cycles (a CAS cycle, a burst cycle, etc.).

The switch SW8(n) of the data transmission control circuit TC(n) for the un-selected non-repeater memory cell array M(n) that is arranged in the position more distant from the data circuit 14 than the selected memory cell array may be set to ON.

Embodiment 5

In Embodiment 5, the read amplifier and the write amplifier that are located in a data input/output portion provided for a memory cell array perform the parallel-serial conversion of data.

Figure 14:
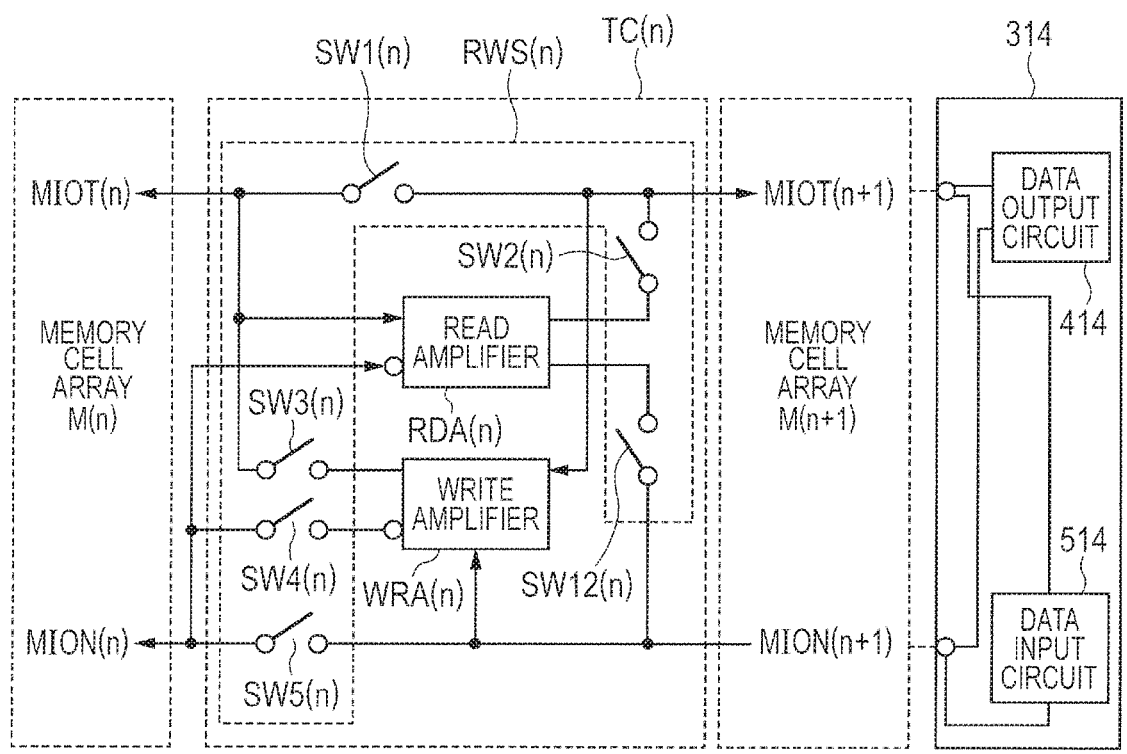
FIG. 14 is a drawing illustrating a data transmission control circuit TC(n) according to Embodiment 5.

FIG. 14 illustrates a data transmission control circuit TC(n) according to Embodiment 5.

According to Embodiment 5, the data circuit 314 includes a data output circuit 414 and a data input circuit 514.

The data output circuit 414 is coupled to the first data wiring MIOT(4) and the second data wiring MION(4). Similarly, the data input circuit 514 is coupled to the first data wiring MIOT(4) and the second data wiring MION(4).

The semiconductor device includes a data transmission control circuit TC(n) corresponding to a memory cell array M(n). The data transmission control circuit TC(n) is arranged in the position adjoining the corresponding memory cell array M(n) and nearer to the data circuit 14 than from the memory cell array M(n). The memory cell array M(n) with a larger n is located nearer to the data circuit 14.

The first data wiring MIOT and the second data wiring MION are divided by the data transmission control circuits TC(0)-TC(3). In the memory cell array M(i), the first data wiring MIOT(i) and the second data wiring MION(i) are arranged, where i=0-3. The first data wiring MIOT(4) and the second data wiring MION(4) couple the data circuit 14 to the data transmission control circuit TC(3).

The data transmission control circuit TC(n) includes a read amplifier RDA(n), a write amplifier WRA(n), and a switching circuit RWS(n). The switching circuit RWS(n)

includes a switch SW1(*n*), a switch SW2(*n*), a switch SW12(*n*), a switch SW3(*n*), a switch SW4(*n*), and a switch SW5(*n*). The read amplifier RDA(n) has two output ports. The first output port of the read amplifier RDA(n) is coupled to the first data wiring MIOT(n+1) via the switch SW2(*n*). The second output port of the read amplifier RDA(n) is coupled to the second data wiring MION(n+1) via the switch SW12(*n*).

First, the operation is explained for the case where read data is continuously outputted from a selected memory cell array M(n).

The following explains the operation in read in the case where the memory cell array M(n) is selected. The following is performed in the first cycle.

In the selected memory cell array M(n), the first data wiring MIOT(n) and the second data wiring MION(n) transmit first differential read data from a selected memory cell MC.

The read amplifier RDA(n) amplifies the first differential read data transmitted via the first data wiring MIOT(n) and the second data wiring MION(n) in the memory cell array M(n), and generates first single-phase read data. The generated first single-phase read data is latched by the read amplifier RDA(n). The switch SW1(*n*), the switch SW3(*n*), the switch SW4(*n*), and the switch SW5(*n*) are set to OFF. The switch SW2(*n*) and the switch SW12(*n*) are set to OFF.

The following is performed in the second cycle.

In the selected memory cell array M(n), the first data wiring MIOT(n) and the second data wiring MION(n) transmit second differential read data from the selected memory cell.

The read amplifier RDA(n) amplifies the second differential read data transmitted via the first data wiring MIOT(n) and the second data wiring MION(n) in the memory cell array M(n), and generates second single-phase read data. The generated second single-phase read data is latched by the read amplifier RDA(n).

Subsequently, the switch SW1(*n*), the switch SW3(*n*), the switch SW4(*n*), and the switch SW5(*n*) keep OFF. The switch SW2(*n*) and the switch SW12(*n*) are set to ON concurrently. According to this setting, the first single-phase read data outputted from the read amplifier RDA(n) is transmitted to the first data wiring MIOT(n+1) that is coupled to the data transmission control circuit TC(n) and is located nearer to the data output circuit 414. The second single-phase read data outputted from the read amplifier RDA(n) is transmitted to the second data wiring MION(n+1) that is coupled to the data transmission control circuit TC(n) and is located nearer to the data output circuit 414. Outputting of the first single-phase read data to the first data wiring MIOT(n+1) and outputting of the second single-phase read data to the second data wiring MION(n+1) are performed concurrently.

It is also preferable to output the first single-phase read data to the second data wiring MION(n+1) and to output the second single-phase read data to the first data wiring MIOT(n+1).

The following explains the operation in read in the case where the memory cell array M(n) is an un-selected repeater memory cell array that is not selected and is located between the data output circuit 414 and the selected memory cell array.

The switch SW1(*n*) and the switch SW5(*n*) are set to ON, and the switch SW2(*n*), the switch SW12(*n*), the switch SW3(*n*), and the switch SW4(*n*) are set to OFF. According to this setting, the first single-phase read data that is transmitted along the first data wiring MIOT(n) is transmitted to the data wiring MIOT(n+1). The second single-phase read data that is transmitted along the second data wiring MION(n) is transmitted to the second data wiring MION(n+1).

Next, the operation in write is explained.

The data output circuit 514 outputs first write data to the first data wiring MIOT(4) and outputs second write data to the second data wiring MION(4).

It is assumed that the memory cell array M(n) is an un-selected repeater memory cell array that is not selected and is located between the data input circuit 515 and the selected memory cell array.

The switch SW1(*n*) and the switch SW5(*n*) are set to ON, and the switch SW2(*n*), the switch SW12(*n*), the switch SW3(*n*), and the switch SW4(*n*) are set to OFF. As a result, the first data wiring MIOT(n+1) and the first data wiring MIOT(n) are coupled, and the second data wiring MION(n+1) and the second data wiring MION(n) are coupled. According to this setting, the first single-phase write data that is transmitted along the first data wiring MIOT(n+1) is transmitted to the first data wiring MIOT(n). The second single-phase write data that is transmitted along the second data wiring MION(n+1) is transmitted to the second data wiring MION(n).

Next, it is assumed that the memory cell array M(n) is the selected memory cell array.

The following is performed in the first cycle.

The write amplifier WRA(n) latches the first single-phase write data that is transmitted along the first data wiring MIOT(n+1) and the second single-phase write data that is transmitted along the second data wiring MION(n+1).

The switch SW1(*n*), the switch SW2(*n*), the switch SW12(*n*), and the switch SW5(*n*) are set to OFF. The switch SW3(*n*) and the switch SW4(*n*) are set to ON. As a result, the output of the write amplifier WRA(n) are coupled to the first data wiring MIOT(n) and the second data wiring MION(n).

The write amplifier WRA(n) generates first differential write data from the first single-phase write data that is latched. The positive phase of the first differential write data outputted from the write amplifier WRA(n) is transmitted to the first data wiring MIOT(n) in the memory cell array M(n), and the negative phase of the first differential write data outputted from the write amplifier WRA(n) is transmitted to the second data wiring MION(n) in the memory cell array M(n).

The following is performed in the second cycle.

The switch SW1(*n*), the switch SW2(*n*), the switch SW12(*n*), and the switch SW5(*n*) keep OFF. The switch SW3(*n*) and the switch SW4(*n*) keep ON. The write amplifier WRA(n) generates second differential write data from the second single-phase write data that is latched. The positive phase of the second differential write data outputted from the write amplifier WRA(n) is transmitted to the first data wiring MIOT(n) in the memory cell array M(n), and the negative phase of the second differential write data outputted from the write amplifier WRA(n) is transmitted to the second data wiring MION(n) in the memory cell array M(n).

FIG. 15 illustrates an operating waveform at the time of continuous read in the related art.

Hitherto, a piece of read data is read out to the first data wiring MIOT(n) and the second data wiring MION(n) for every read cycle. The continuous read data is successively transmitted to the first data wiring MIOT(n+1).

FIG. 16 illustrates an operating waveform at the time of continuous read in Embodiment 5.

In the same manner as in the past, in Embodiment 5, a piece of read data is read out to the first data wiring MIOT(n)

and the second data wiring MION(n) for every read cycle. However, in Embodiment 5, different from the past, every two pieces of the continuous read data are concurrently transmitted to the first data wiring MIOT(n+1) and the second data wiring MION(n+1).

According to Embodiment 5, it is possible to reduce the frequency of the data transfer cycle to half of that in the past. As a result, when the size of the memory capacity is expanded and the global wiring becomes very long, it is possible to avoid a problem that the data transfer takes long time.

(A Modified Example of Embodiment 5)

In the modified example, as is the case with Embodiment 5, continuous data is transmitted via one wiring that is selected alternately out of the two data wirings. In the present modified example, two pieces of data are not transmitted to two data wirings completely concurrently such as in Embodiment 5, but there is a time lag in transmitting the two pieces of data.

Figure 17:
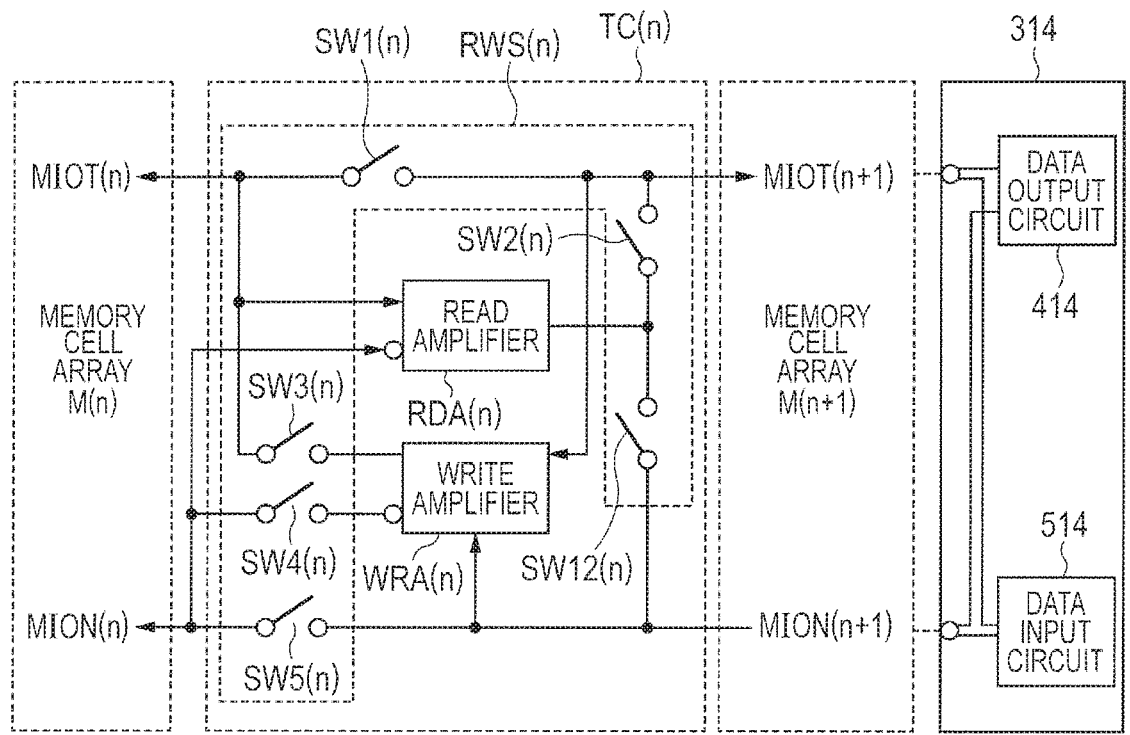
FIG. 17 is a drawing illustrating a data transmission control circuit TC(n) according to a modified example of Embodiment 5.

FIG. 17 illustrates a data transmission control circuit TC(n) according to the modified example of Embodiment 5.

The read amplifier RDA(n) has one output port. The output port of the read amplifier RDA(n) is coupled to the first data wiring MIOT(n+1) via the switch SW2($n$) and coupled to the second data wiring MION(n+1) via the switch SW12($n$).

The following explains the operation in read in the case where the memory cell array M(n) is selected.

First, the read amplifier RDA(n) amplifies first differential read data transmitted via the first data wiring MIOT(n) and the second data wiring MION(n) in the memory cell array M(n), and generates first single-phase read data. The generated first single-phase read data is latched by the read amplifier RDA(n). The switch SW1($n$), the switch SW3($n$), the switch SW4($n$), and the switch SW5($n$) are set to OFF. The switch SW2($n$) and the switch SW12($n$) are set to OFF.

The read amplifier RDA(n) amplifies second differential read data transmitted via the first data wiring MIOT(n) and the second data wiring MION(n) in the memory cell array M(n), and generates second single-phase read data. The generated second read data is latched by the read amplifier RDA(n).

Subsequently, the switch SW1($n$), the switch SW3($n$), the switch SW4($n$), and the switch SW5($n$) keep OFF.

First, the switch SW2($n$) is set to ON. According to this setting, the first single-phase read data outputted from the read amplifier RDA(n) is transmitted to the first data wiring MIOT(n+1) that is coupled to the data transmission control circuit TC(n) and is located nearer to the data output circuit 414.

Next, before the transmission of the first single-phase read data to the first data wiring MIOT(n+1) is completed, the switch SW2($n$) is set to OFF and the switch SW12($n$) is set to ON. According to this setting, the second single-phase read data outputted from the read amplifier RDA(n) is transmitted to the second data wiring MION(n+1) that is coupled to the data transmission control circuit TC(n) and is located nearer to the data output circuit 414.

In the present modified example, it is possible to transmit the second read data to the data wiring MION(n+1), before outputting of the first read data from the read amplifier is completed and all pieces of the first read data arrive to the first data wiring MIOT(n+1).

Embodiment 6

In Embodiment 6, the signal that is transmitted to a data wiring in the selected memory cell array is assumed to be a single-phase signal.

Figure 18:
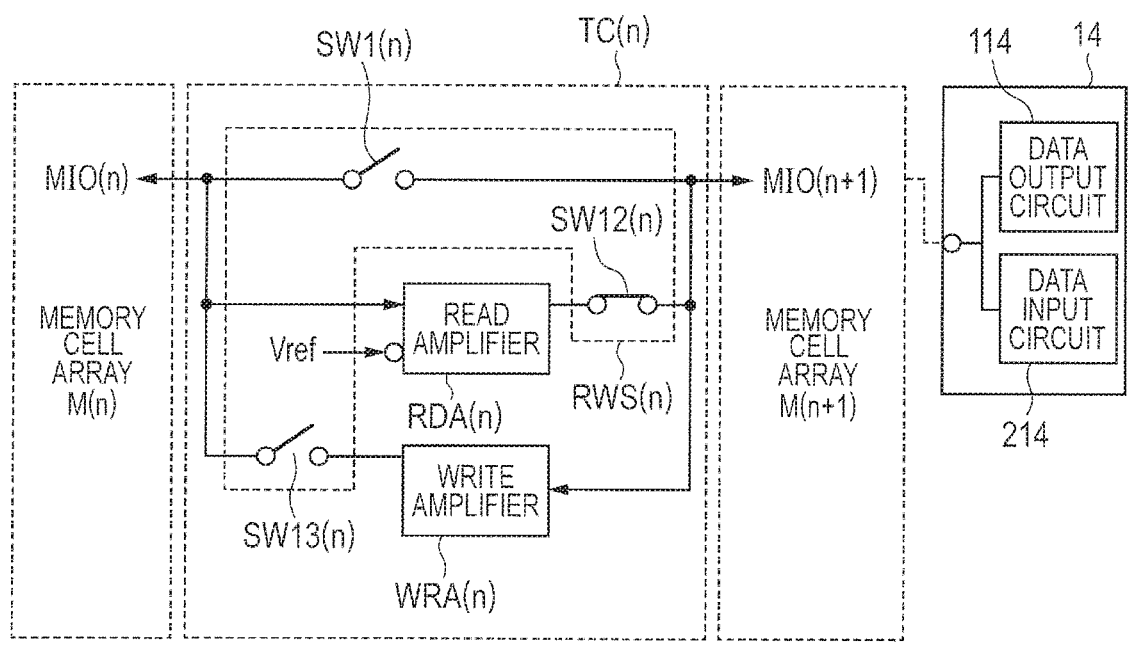
FIG. 18 is a drawing illustrating a data transmission control circuit TC(n) according to Embodiment 6.

FIG. 18 illustrates a data transmission control circuit TC(n) according to Embodiment 6.

The data circuit 14 includes a data output circuit 114 and a data input circuit 214.

The data output circuit 114 and the data input circuit 214 are arranged near one end of an area where the memory cell arrays M(0)-M(3) are arranged.

The data output circuit 114 and the data input circuit 214 are coupled to one end of a data wiring MIO.

The semiconductor device includes a data transmission control circuit TC(n) corresponding to the memory cell array M(n). The data transmission control circuit TC(n) is arranged in the position adjoining the corresponding memory cell array M(n) and nearer to the data circuit 14 than from the memory cell array M(n).

The data transmission control circuit TC(n) includes a read amplifier RDA(n), a write amplifier WRA(n), and a switching circuit RWS(n).

The data wiring MIO is divided by the data transmission control circuits TC(0)-TC(3).

One of the memory cell arrays M(0)-M(3) is selected and activated by a memory cell array selection address decoder 12. In the case of read and write, the memory cell array selection address decoder 12 selects one of the data transmission control circuits TC(0)-TC(3), outputs a selection switching control signal to the selected data transmission control circuit, and outputs a non-selection switching control signal to the un-selected data transmission control circuit.

In the selected memory cell array, a memory cell is selected by a bit line and a word line.

The data wiring MIO(n) in the memory cell array M(n) is coupled to the read amplifier RDA(n) and the write amplifier WRA(n). The read amplifier RDA(n) amplifies a difference of the single-phase read data from the memory cell MC on the data wiring MIO(n) and the reference voltage Vref. The write amplifier WRA(n) outputs single-phase write data to the data wiring MIO(n).

The switching circuit RWS(n) includes a switch SW1($n$), a switch SW12($n$), and a switch 13($n$).

In a selected memory cell array, the first data wiring MIOT and the second data wiring MION function as a local wiring that transmits the corresponding differential data to a circuit-wise lower-order bus. In at least one memory cell array that is not selected and is located between the data circuit 14 and the selected memory cell array, the first data wiring MIOT functions as the read bus wiring and the write bus wiring that transmits the corresponding single-phase logical-level data to a circuit-wise higher-order bus. In at least one memory cell array that is not selected and is located between the data circuit 14 and the selected memory cell array, the second data wiring MION may function as a shielding wiring.

The memory cell array selection address decoder 12 selects one memory cell array from the memory cell arrays M(0)-M(3). In the following, it is assumed that the memory cell array M(n) is selected.

The operation in read is explained.

In the selected memory cell array M(n), the data wiring MIO(n) transmits the single-phase read data from the selected memory cell. The read amplifier RDA(n) of the data transmission control circuit TC(n) corresponding to the selected memory cell array M(n) amplifies the difference of the read data and the reference voltage Vref. In the switching circuit RWS(n) of the data transmission control circuit TC(n), the switch SW12($n$) is set to ON, and the switch SW1($n$) and the switch SW13($n$) are set to OFF. Consequently, the output of the read amplifier RDA(n) is coupled to the data wiring MIO(n+1) that is coupled to the data transmission control circuit TC(n) and is located nearer to the data output circuit 114.

In the switching circuit RWS(m) of the data transmission control circuit TC(m) corresponding to an un-selected repeater memory cell array M(m) that is not selected and is located between the data output circuit 114 and the selected memory cell array M(n), the switch SW1(*m*) is set to ON, and the switch SW12(*m*) and the switch SW13(*m*) are set to OFF. Consequently, the data wiring MIO(m) in the un-selected repeater memory cell array M(m) is coupled to the data wiring MIO(m+1) that is coupled to the data transmission control circuit TC(m) and is located nearer to the data output circuit 114. Here, m is equal to or greater than n+1.

Next, the following explains the operation in write in the case where the memory cell array M(n) is selected.

The data input circuit 214 outputs the write data to the data wiring MIO(4).

In the switching circuit RWS(m) of the data transmission control circuit TC(m) corresponding to an un-selected repeater memory cell array M(m) that is not selected and is located between the data input circuit 214 and the selected memory cell array M(n), the switch SW1(*m*) is set to ON, and the switch SW12(*m*) and the switch SW13(*m*) is set to OFF. As a result, the data wiring MIO(m+1) that is coupled to the data transmission control circuit TC(m) and is located nearer to the data input circuit 214 is coupled to the data wiring MIO(m) in the un-selected repeater memory cell array M(m). Here, m is equal to or greater than n+1.

The write amplifier WRA(n) of the data transmission control circuit TC(n) corresponding to a selected memory cell array M(n) generates single-phase write data, based on the write data transmitted via the data wiring MIO(n+1) that is coupled to the transmission control circuit TC(n) and is located nearer to the data input circuit 214.

In the switching circuit RWS(n) of the data transmission control circuit TC(n) corresponding to the selected memory cell array M(n), the switch SW13(*n*) is set to ON, and the switch SW1(*n*) and the switch SW12(*n*) are set to OFF. As a result, the output of the write amplifier WRA(n) is coupled to the data wiring MIO(n) in the selected memory cell array M(n). The data wiring MIO(n) in the selected memory cell array M(n) transmits the single-phase write data to the selected memory cell.

Figure 19:
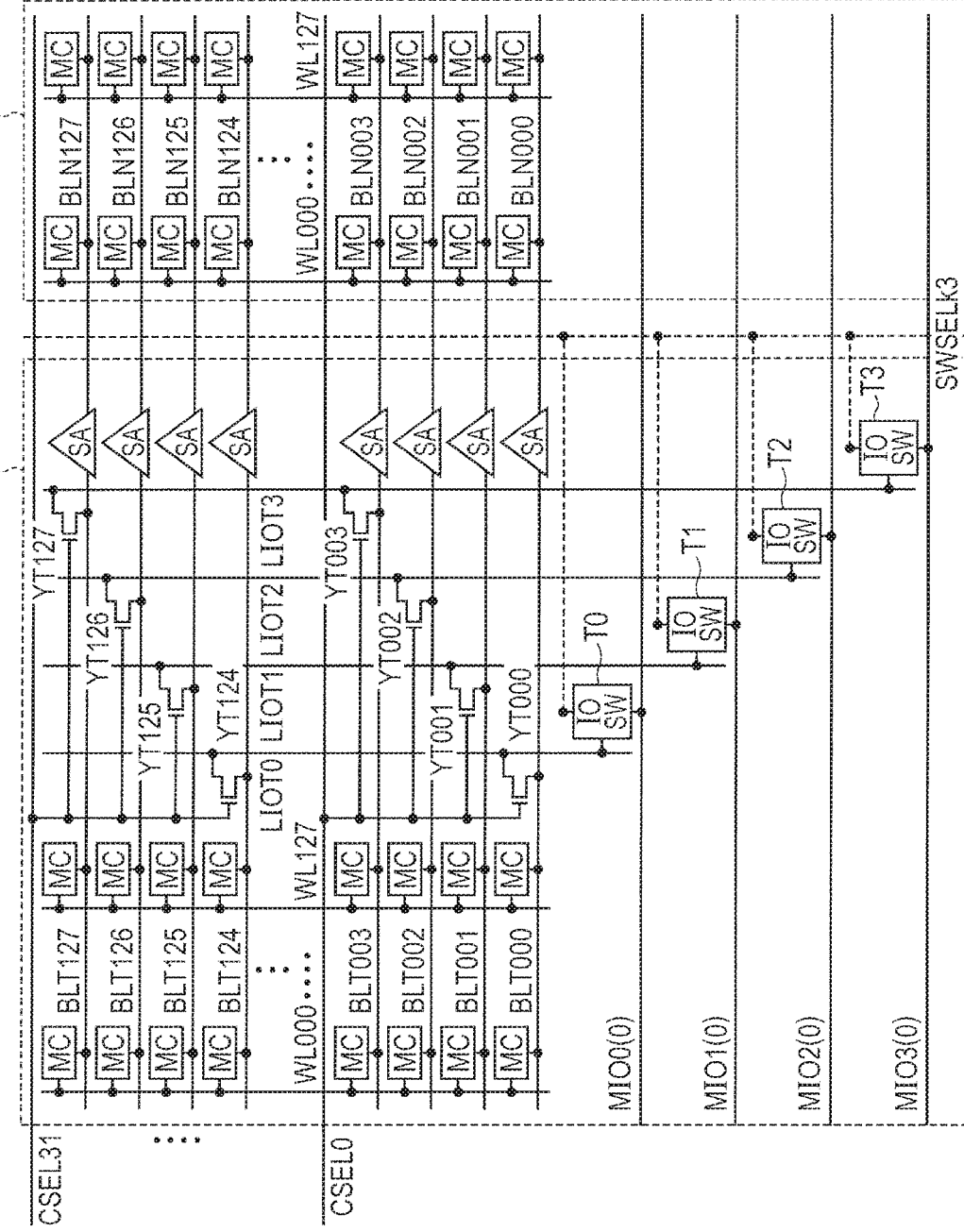
FIG. 19 is a drawing illustrating an example of the configuration of a memory cell array according to Embodiment 6.

FIG. 19 illustrates an example of the configuration of a memory cell array according to Embodiment 6.

As illustrated in FIG. 19, one memory cell array M(i) includes multiple memory cells MC arranged in a matrix. The memory cell array M(i) has 128 columns, and 128 bit lines BLT000-BLT127 and BLN000-BLN127. A bit-line pair configured with the bit line BLT of the memory cell array M(i) and the bit line BLN of the memory cell array M(i+1) adjoining the memory cell array M(i) are coupled to the sense amplifier SA. Four bit-line pairs BLT4*n+s* and BLN4*n+s* (s=0, 1, 2, 3) are selected by the column selection signal CSELn (n=0-31).

32 bit lines BLT4*n* (n=0-31) are coupled to the data line LIOT0 via a column selection switch YT4*n* (n=0-31) to which the column selection signal CSELn (n=0-31) is supplied. In the same manner, 32 bit lines BLT4*n*+1 (n=0-31) are coupled to the data line LIOT1 via a column selection switch YT4*n*+1 (n=0-31) to which the column selection signal CSELn (n=0-31) is supplied. 32 bit lines BLT4*n*+2 (n=0-31) are coupled to the data line LIOT2 via a column selection switch YT4*n*+2 (n=0-31) to which the column selection signal CSELn (n=0-31) is supplied. 32 bit lines BLT4*n*+3 (n=0-31) are coupled to the data line LIOT3 via a column selection switch YT4*n*+3 (n=0-31) to which the column selection signal CSELn (n=0-31) is supplied.

The column selection switch YT may be configured with an N channel transistor coupled between the bit line BLT and the data line LIOT, as illustrated in FIG. 19.

The data line LIOTk (k=0-3) is coupled to the data wiring MIOTk(i) via a switch IOSWTk. The switch IOSWTk is selected by a switch selection signal SWSELk. The switch IOSWTk may have the same configuration as the column selection switch.

In the configuration of the memory cell array illustrated in FIG. 19, four data wirings MIO0(0)-MIO3(0) are arranged in one memory cell array M(0). Therefore, four data transmission control circuits TC illustrated in FIG. 18 are required for one memory cell array.

According to Embodiment 6, it is possible to transmit data by means of one data wiring MIO per a piece of data. As a result, according to Embodiment 6, it is possible to handle the multi-bit data with more bit numbers.

Embodiment 7

Figure 20:
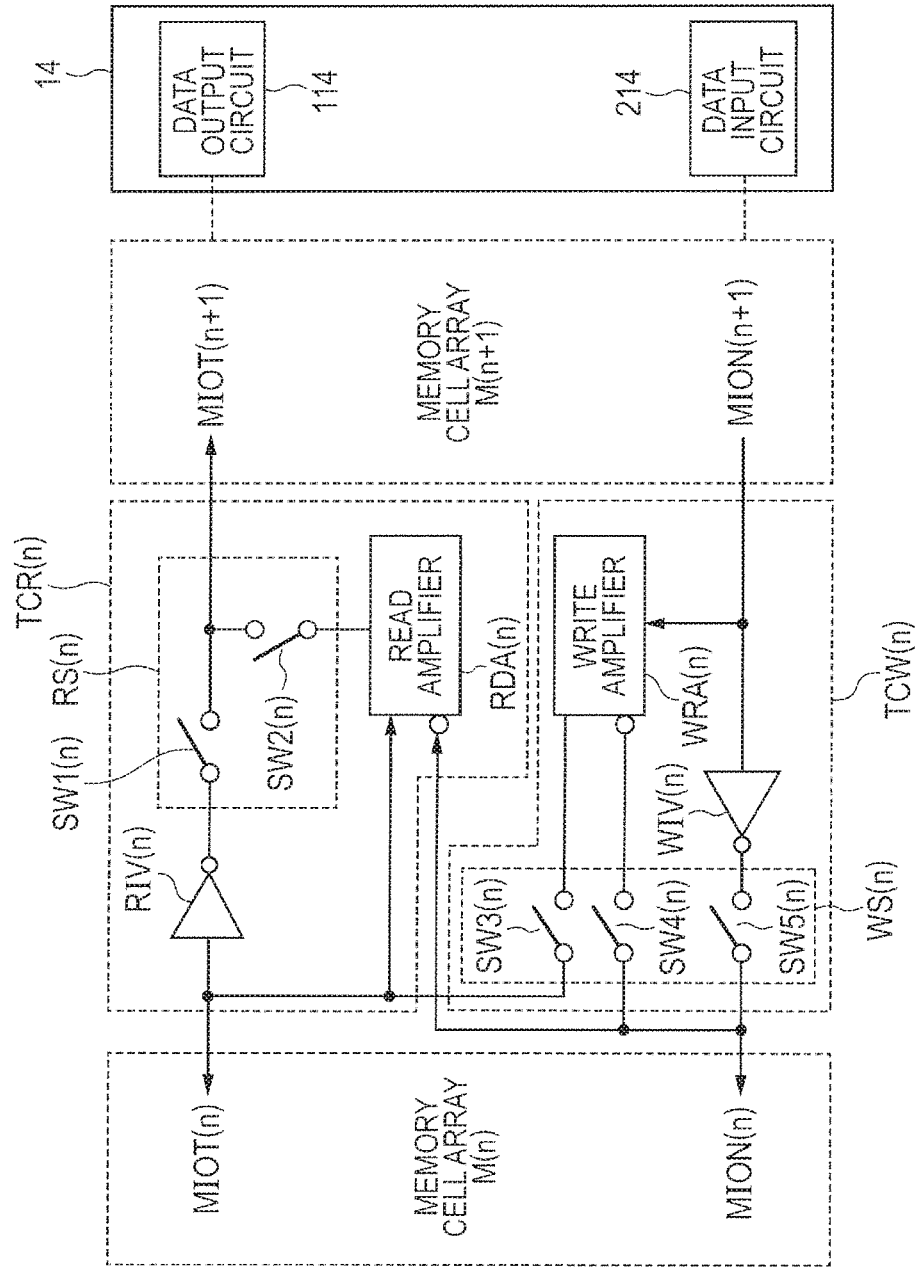
FIG. 20 is a drawing illustrating a first data transmission control circuit TCR(n) and a second data transmission control circuit TCW(n) according to Embodiment 7.

FIG. 20 illustrates a first data transmission control circuit TCR(n) and a second data transmission control circuit TCW(n) according to Embodiment 7.

The first data transmission control circuit TCR(n) according to Embodiment 7 includes an inverter RIV(n) in addition to the configuration of the first data transmission control circuit TCR(n) according to Embodiment 2.

The second data transmission control circuit TCW(n) according to Embodiment 7 includes an inverter WIV(n) in addition to the configuration of the second data transmission control circuit TCW(n) according to Embodiment 2.

The input of the inverter RIV(n) is coupled to the first data wiring MIOT(n) in the corresponding memory cell array M(n). The output of the inverter RIV(n) is coupled to the switch SW1(*n*) of the switching circuit RS(n).

The input of the inverter WIV(n) is coupled to the second data wiring MION(n+1) that is coupled to the second data transmission control circuit TCW(n) and is located nearer the data input circuit 214. The output of the inverter WIV(n) is coupled to the switch SW5(*n*) of the switching circuit WS(n).

The following explains the operation in read in the case where the memory cell array M(n) is not selected. The switch SW1(*n*) is set to ON. The switch SW2(*n*), the switch SW3(*n*), the switch SW4(*n*), and the switch SW5(*n*) are set to OFF. According to this setting, the single-phase logical-level read data that is transmitted along the first data wiring MIOT(n) is inverted in phase by the inverter RIV(n) and transmitted to the first data wiring MIOT(n+1).

Next, the following explains the operation in write in the case where the memory cell array M(n) is not selected. The switch SW5(*n*) is set to ON. The switch SW2(*n*), the switch SW3(*n*), the switch SW4(*n*), and the switch SW1(*n*) are set to OFF. According to this setting, the single-phase logical-level write data that is transmitted along the second data wiring MION(n+1) is inverted in phase by the inverter WIV(n) and transmitted to the second data wiring MION(n).

According to Embodiment 7, when the scale of the memory becomes large leading to a long global bus wiring and a heavy load, the bus drive current is distributed for every un-selected memory cell array, and the direction of the power supply current for charge and discharge is also distributed. Therefore, it is possible to reduce the adverse influence of the power supply noise due to a peak current.

Embodiment 8

In a semiconductor device according to Embodiment 8, a data input circuit and a data output circuit are arranged mutually on the opposite side.

Figure 21:
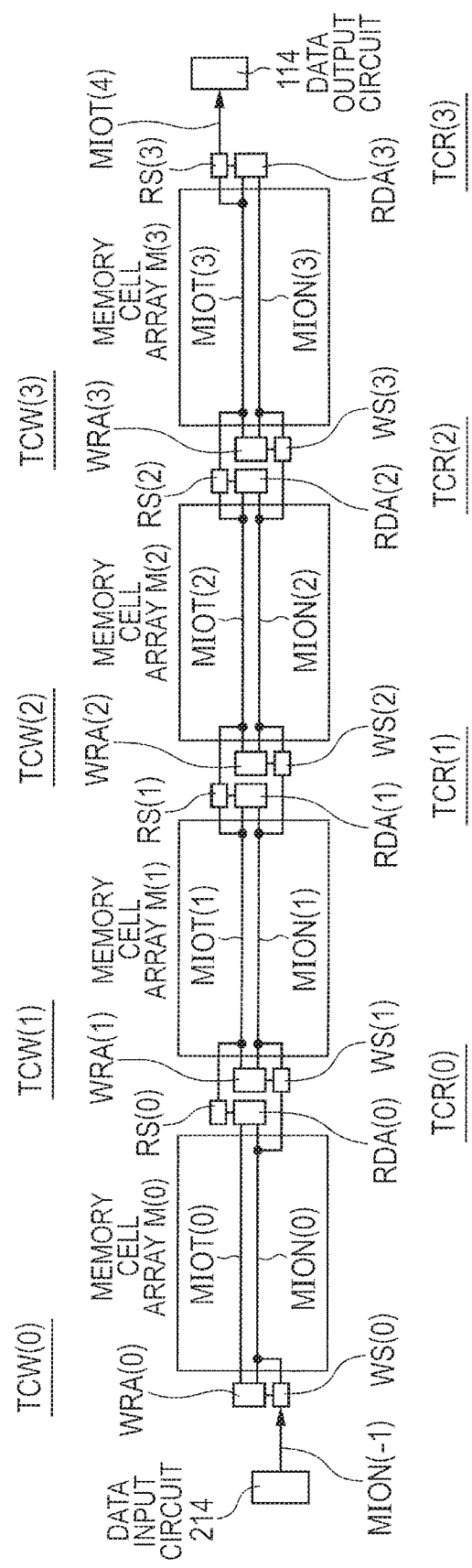
FIG. 21 is a drawing illustrating the configuration of a semiconductor device according to Embodiment 8.

FIG. 21 illustrates the configuration of a semiconductor device according to Embodiment 8.

The semiconductor device according to Embodiment 8 is different from the semiconductor device according to Embodiment 2 in the following point.

In Embodiment 2, the data output circuit 114 and the data input circuit 214 are arranged in proximity to one end (right side) of the area where the memory cell arrays M(0)-M(3) are arranged. The data output circuit 114 is coupled to one end (right side) of the first data wiring MIOT. The data input circuit 214 is coupled to one end (right side) of the second data wiring MION.

As opposed to this, in Embodiment 8, the data output circuit 114 is arranged in proximity to one end (right side) of the area where the memory cell arrays M(0)-M(3) are arranged, and the data input circuit 214 is arranged in proximity to the other end (left side) of the area where the memory cell arrays M(0)-M(3) are arranged. The data output circuit 114 is coupled to one end (right side) of the first data wiring MIOT, and the data input circuit 214 is coupled to one end (left side) of the second data wiring MION. The one end (left side) of the second data wiring MION is the end that is located near the other end (left side) of the first data wiring MIOT.

In Embodiment 8, as is the case with Embodiment 2, the first data transmission control circuit TCR(n) and the second data transmission control circuit TCW(n) are arranged. That is, the data transmission control circuit TCR(n) is arranged in the position adjoining the corresponding memory cell array M(n) and nearer to the data output circuit 114 than from the corresponding memory cell array M(n). The second data transmission control circuit TCW(n) is arranged in the position adjoining the corresponding memory cell array M(n) and nearer to the data input circuit 214 than from the corresponding memory cell array M(n).

In Embodiment 8, at the case of read, the read data outputted from a selected memory cell array is transmitted via the first data wiring MIOT to the data output circuit 114 arranged at one end (right side) of the area where the memory cell arrays M(0)-M(3) are arranged.

At the case of write, the write data outputted from the data input circuit 214 arranged at the other end (left side) of the area where the memory cell arrays M(0)-M(3) are arranged is transmitted to the selected memory cell array via the second data wiring MION.

Figure 22:
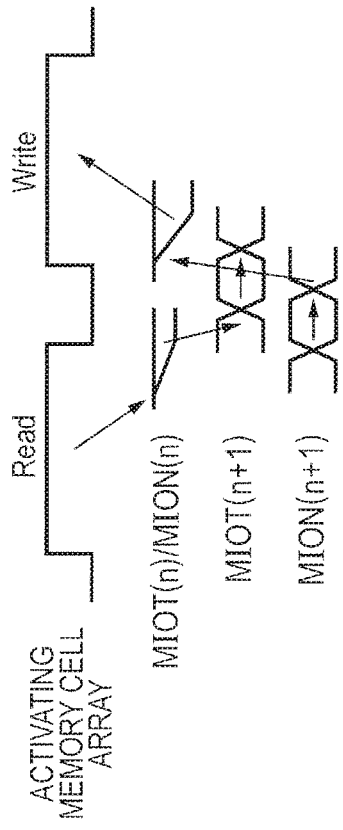
FIG. 22 is a drawing illustrating operation timing in Embodiment 8.

FIG. 22 illustrates operation timing in Embodiment 8.

As illustrated in FIG. 22, at the time of switching from read to write, it is possible to overlap the timing of the read data that is transmitted to the first data wiring MIOT(n+1) and the timing of the write data that is transmitted along the first data wiring MION(n+1). By this device, it is possible to attain speeding up of the cycle.

The data output circuit 114 may be arranged in proximity to one end (left side) of the area where the memory cell arrays M(0)-M(3) are arranged, and the data input circuit 214 may be arranged in proximity to the other end (right side) of the area where the memory cell arrays M(0)-M(3) are arranged.

Embodiment 9

Figure 23:
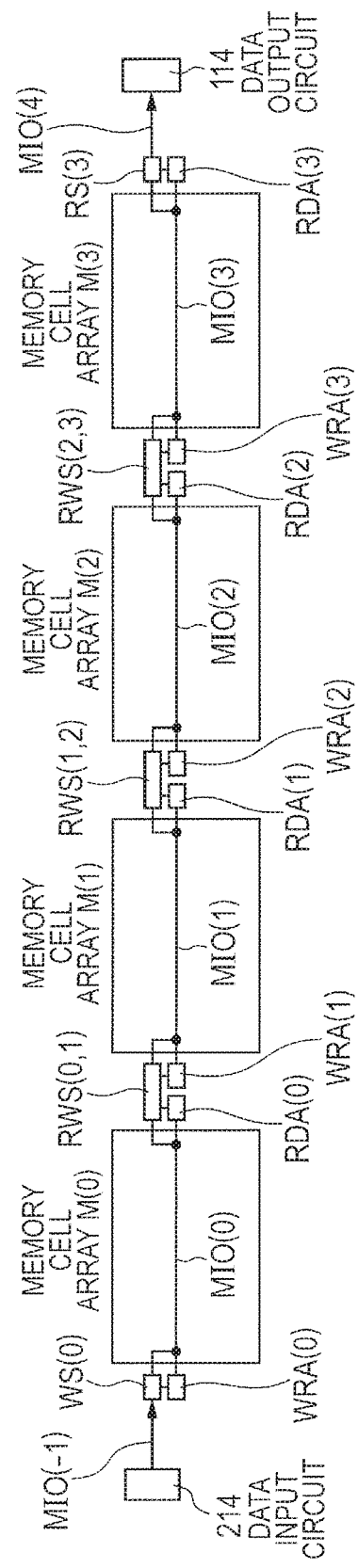
FIG. 23 is a drawing illustrating the configuration of a semiconductor device according to Embodiment 9.

FIG. 23 illustrates the configuration of a semiconductor device according to Embodiment 9.

The semiconductor device according to Embodiment 9 is different from the semiconductor device according to Embodiment 6 in the following points.

In Embodiment 6, the data output circuit 114 and the data input circuit 214 are arranged near one end of the area where the memory cell arrays M(0)-M(3) are arranged and the data output circuit 114 and the data input circuit 214 are coupled to one end of the data wiring MIO.

In Embodiment 9, the data output circuit 114 is arranged in proximity to one end (right side) of the area where the memory cell arrays M(0)-M(3) are arranged, and the data input circuit 214 is arranged in proximity to the other end (left side) of the area where the memory cell arrays M(0)-M(3) are arranged. The data output circuit 114 is coupled to one end (right side) of the data wiring MIO, and the data input circuit 214 is coupled to the other end (left side) of the data wiring MIO.

In Embodiment 9, the read amplifier RDA(n) and the switching circuit RS(n) that configure the data transmission control circuit TC(n) are arranged in the position that adjoins the corresponding memory cell array M(n) and is nearer to the data output circuit 114. The write amplifier WRA(n) and the switching circuit WS(n) that configure the data transmission control circuit TC(n) are arranged in the position that adjoins the corresponding memory cell array M(n) and is nearer to the data input circuit 214.

The switching circuit RWS(n, n+1) illustrated in FIG. 23 has the function of the switching circuit RS(n) and the switching circuit WS(n+1).

When the memory cell array M(n) is a selected memory cell array at the case of read, the switching circuit RS(n) couples the output of the read amplifier RDA(n) to the data wiring MIO(n+1) that is coupled to the switching circuit RS(n) and is located nearer to the data output circuit 114.

When the memory cell array M(n) is an un-selected repeater memory cell array at the case of read, the switching circuit RS(n) couples the data wiring MIO(n) in the memory cell array M(n) to the data wiring MIO(n+1) that is coupled to the switching circuit RS(n) and is located nearer to the data output circuit 114.

When the memory cell array M(n) is an un-selected repeater memory cell array at the case of write, the switching circuit WS(n) couples the data wiring MIO(n−1) that is coupled to the switching circuit WS(n) and is located nearer the data input circuit 214 to the data wiring MIO(n) in the memory cell array M(n).

When the memory cell array M(n) is a selected memory cell array at the case of write, the switching circuit WS(n) couples the output of the write amplifier WRA(n) to the data wiring MIO(n) in the memory cell array M(n).

In Embodiment 9, at the case of read, the read data outputted from the selected memory cell array is transmitted via the data wiring MIO to the data output circuit 114 arranged at one end (right side) of the area where the memory cell arrays M(0)-M(3) are arranged.

At the case of write, the write data outputted from the data input circuit 214 arranged at the other end (left side) of the area where the memory cell arrays M(0)-M(3) are arranged is transmitted to the selected memory cell array via the data wiring MIO.

In Embodiment 9, at the case of read, in the un-selected memory cell array on the right side of the selected memory cell array, the data wiring MIO functions such as a read-dedicated bus. At the case of write, in the memory cell array on the left side of the selected memory cell array, the data wiring MIO functions such as a write dedicated bus. According to the device, as is the case with Embodiment 8, at the time of switching from read to write, it is possible to overlap the timing of the read data that is transmitted to the data wiring MIO(n+1) and the timing of the write data that is transmitted along the data wiring MIO(n).

The data input circuit 214 may be coupled to one end (right side) of the data wiring MIO, and the data output circuit 114 may be coupled to the other end (left side) of the data wiring MIO.

Embodiment 10

In Embodiment 10, an address wiring AIOT to transmit an address signal is used in place of the data wiring MIOT.

Figure 24:
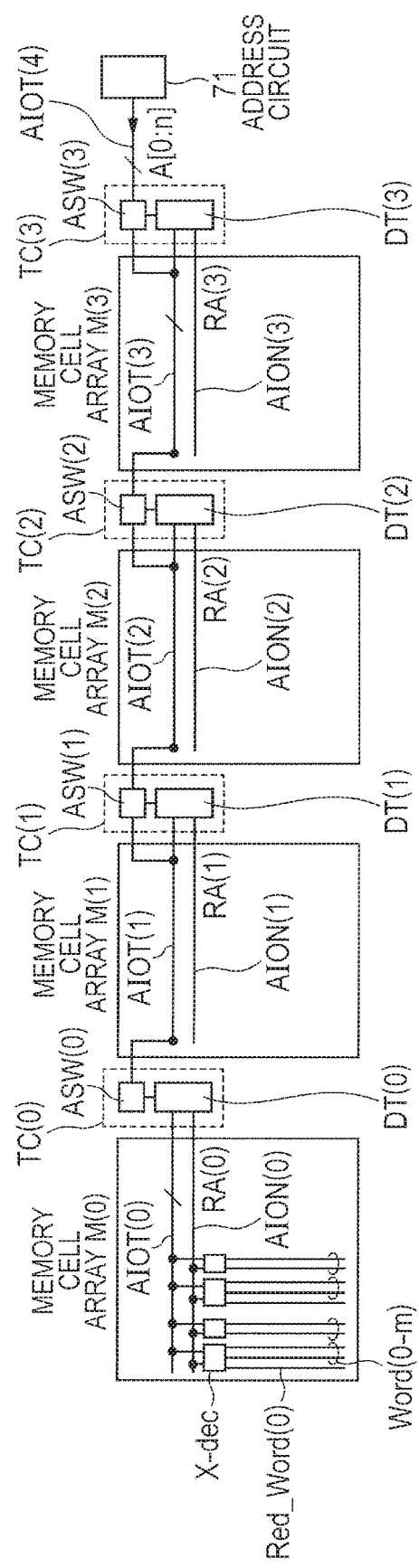
FIG. 24 is a drawing illustrating the configuration of a semiconductor device according to Embodiment 10.

FIG. 24 illustrates the configuration of a semiconductor device according to Embodiment 10.

The semiconductor device includes memory cell arrays M(0)-M(3), an address wiring AIOT arranged ranging over the memory cell arrays M(0)-M(3), and an address circuit 71.

Corresponding to the memory cell array M(n), a data transmission control circuit TC(n) is arranged. The data transmission control circuit TC(n) is arranged adjoining the memory cell array M(n) and nearer to the address circuit 71. The data transmission control circuit TC(n) includes a switching circuit ASW(n) and a redundancy determination circuit DT(n).

The address wiring AIOT is divided by the data transmission control circuits TC(0)-TC(3). An address wiring AIOT(i) is arranged in the memory cell array M(i), where i=0-3. The address wiring AIOT(4) couples the address circuit 71 to the data transmission control circuit TC(3).

The address circuit 71 is coupled to one end of the address wiring AIOT and outputs an address to the address wiring AIOT.

Each of the memory cell arrays M(0)-M(3) is divided into a number of subblocks that select multiple word lines finally. In the subblock, a redundancy spare word line and a decoder X-dec are arranged.

In a selected memory cell array among the memory cell arrays M(0)-M(3), the address wiring AIOT functions as a local wiring that transmits an address in the selected memory cell array or a redundant address for replacing the address. In a memory cell array that is not selected in the memory cell arrays and is located between the address circuit 71 and the selected memory cell array, the address wiring AIOT functions as a global wiring that transmits an address in the selected memory cell array.

In the following, the operation of the semiconductor device is explained.

One of the memory cell arrays M(0)-M(3) is selected by a decoder(not shown), and the data transmission control circuit corresponding to the selected memory cell array is selected. Here, it is assumed that the memory cell array M(0) and the data transmission control circuit TC(0) are selected.

The address circuit 71 outputs an address signal A[0:*n*].

The switching circuit ASW(3) receives the address signal A[0:*n*]. The data transmission control circuit TC(3) is not selected; accordingly, the switching circuit ASW(3) transmits the address signal A[0:*n*] to the address wiring AIOT (3). The switching circuit ASW(2) receives the address signal A[0:*n*]. The data transmission control circuit TC(2) is not selected; accordingly, the switching circuit ASW(2) transmits the address signal A[0:*n*] to the address wiring AIOT(2). The switching circuit ASW(1) receives the address signal A[0:*n*]. The data transmission control circuit TC(1) is not selected; accordingly, the switching circuit ASW(1) transmits the address signal A[0:*n*] to the address wiring AIOT(1). The switching circuit ASW(0) receives the address signal A[0:*n*]. The data transmission control circuit TC(0) is selected; accordingly, the switching circuit ASW(0) transmits the address signal [0:*n*] to the redundancy determination circuit DT(0).

The redundancy determination circuit DT(0) determines whether the address specified by the inputted address signal A[0:*n*] is the address for replacement to a redundant memory cell. When it is determined that the specified address is not the address for replacement to the redundant memory cell, the redundancy determination circuit DT(0) outputs the inputted address signal A[0:*n*] to the address wiring AIOT (0), and outputs to the wiring AION(0) a flag RA(0)(=0) to specify that the replacement to the redundant memory cell is not performed. When it is determined that the specified address is the address for replacement to the redundant memory cell, the redundancy determination circuit DT(0) generates a redundant address signal RADD[0:*n*] to specify the address of the redundant memory cell and outputs the signal to the address wiring AIOT(0), and outputs to the wiring AION(0) a flag RA(0)(=1) to specify that the replacement to the redundant memory cell is performed.

The decoder X-dec receives the address signal ADD or the redundant address signal RADD from the address wiring AIOT(0) and the flag RA(0) from the wiring AION(0), and based on these, the decoder X-dec selects a word line Word(0-*m*) or a redundant word line Red_Word0.

Generally, the address signal becomes several tens or more as the memory scale increases. However, the following explains the simplified case where one word line is selected from 256 word lines by eight addresses (n=7). In the past, eight wirings for the address signal A[0:7] and nine wirings for the redundant address signal RADD[0:8] (address after replacement of A[0:7]+flag RA) have been necessary. That is, 17 wirings are arranged ranging over the memory cell array. In Embodiment 10, eight of nine signal wirings used as the redundant address signal RADD in the selected memory cell array are used as the wirings to transmit the address signal A in the un-selected memory cell array. According to this device, it is possible to reduce the number of the wirings to nine from 17 in the past. The load of the address signal is dispersed and mitigated due to the division of the array blocks and the division and hierarchy of the redone determination circuit. Accordingly, it is possible to maintain the high-speed operation of the address selection operation.

Embodiment 11

Figure 25:
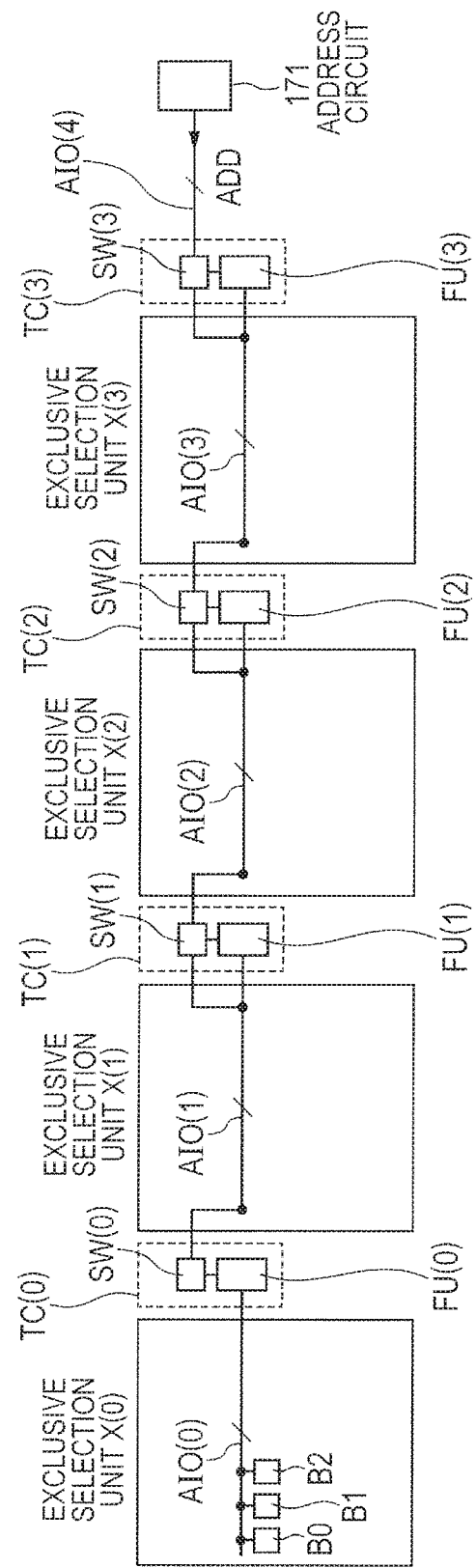
FIG. 25 is a drawing illustrating the configuration of a semiconductor device according to Embodiment 11.

FIG. 25 illustrates the configuration of a semiconductor device according to Embodiment 11.

The semiconductor device includes multiple exclusive selection units X(0)-X(3), an address wiring AIO arranged ranging over the exclusive selection units X(0)-X(3), and an address circuit 171.

Corresponding to the exclusive selection units X(n), a data transmission control circuit TC(n) is arranged. The data transmission control circuit TC(n) is arranged adjoining the exclusive selection units X(n) and nearer to the address circuit 171. The data transmission control circuit TC(n) includes a switching circuit SW(n) and a substitution determination circuit FU(n).

The address wiring AIO is divided by the data transmission control circuits TC(0)-TC(3). The address wiring AIO(i) is arranged in the exclusive selection units X(i), where i=0-3. The address wiring AIO(4) couples the address circuit 171 to the data transmission control circuit TC(3).

The address circuit 171 is coupled to one end of the address wiring AIO and outputs an address to the address wiring AIO.

The exclusive selection unit X(i) includes multiple functional units B0-Bm. The functional units are such as a word driver and a read driver.

In an exclusive selection unit selected among the exclusive selection units X(0)-X(3), the address wiring AIO functions as a local wiring that transmits an address or an address for replacing the address of the functional unit Bi in the selected exclusive selection circuit. In an exclusive selection unit that is not selected among the exclusive selection units X(0)-X(3) and is located between the address circuit 171 and the selected exclusive selection unit, the address wiring AIO functions as a global wiring that transmits the address of the functional unit Bi in the selected exclusive selection unit.

In the following, the operation of the semiconductor device is explained.

One of the exclusive selection units X(0)-X(3) is selected by a decoder (not shown), and the data transmission control circuit corresponding to the selected memory cell array is selected. Here, it is assumed that the m exclusive selection units X(0) and the data transmission control circuit TC(0) are selected.

The address circuit 171 outputs an address signal ADD.

The switching circuit SW(3) receives the address signal ADD. The data transmission control circuit TC(3) is not selected; accordingly, the switching circuit SW(3) transmits the address signal ADD to the address wiring AIO(3). The switching circuit SW(2) receives the address signal ADD. The data transmission control circuit TC(2) is not selected; accordingly, the switching circuit SW(2) transmits the address signal ADD to the address wiring AIO(2). The switching circuit SW(1) receives the address signal ADD. The data transmission control circuit TC(1) is not selected; accordingly, the switching circuit SW(1) transmits the address signal ADD to the address wiring AIO(1). The switching circuit SW(0) receives the address signal ADD. The data transmission control circuit TC(0) is selected; accordingly, the switching circuit SW(0) transmits the address signal ADD to the substitution determination circuit FU(0).

When a functional unit specified by the received address signal ADD is normal, the substitution determination circuit FU(0) outputs the address signal ADD as it is to the address wiring AIO(0).

For example, when the address signal ADD specifies a functional unit B0 and the functional unit B0 is normal, the address signal ADD that specifies the functional unit B0 is outputted to the address wiring AIO(0) and the functional unit B0 is selected.

When the functional unit specified by the received address signal ADD is in a failed state, the substitution determination circuit FU(0) outputs the address of another functional unit that replaces the functional unit in the failed state to the address wiring AIO(0).

For example, when the address signal ADD specifies the functional unit B0 that is in a failed state, and when a replaceable unit for the functional unit B0 is a functional unit B2, the address signal ADD' that specifies the functional unit B2 is outputted to the address wiring AIO(0) and the functional unit B2 is specified.

It is possible to apply Embodiment 11 to a semiconductor logic with multi-bit width that has no memory.

Embodiment 12

Embodiment 12 is related to the configuration in which a hierarchy level is further increased in the hierarchy bus configuration of Embodiment 1 to Embodiment 9.

Figure 26:
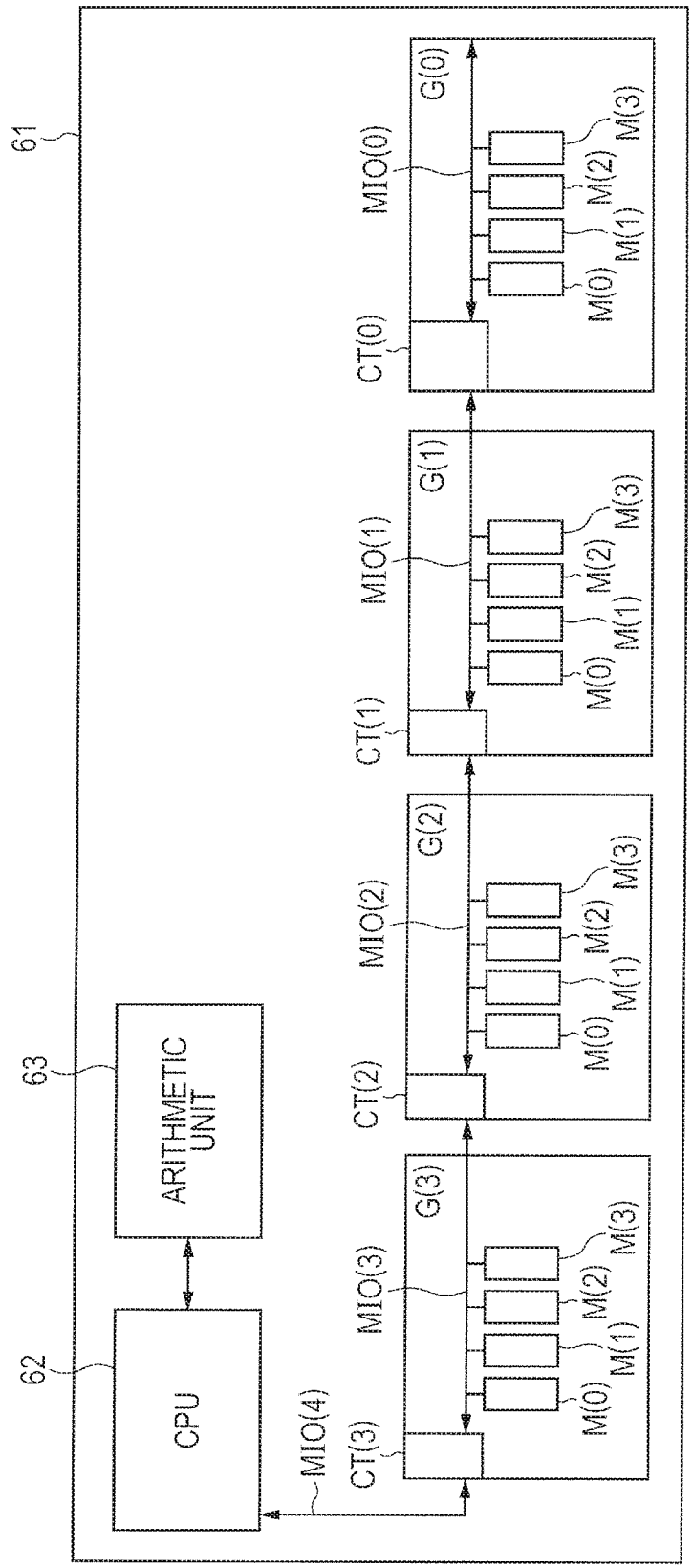
FIG. 26 is a drawing illustrating the configuration of a controller according to Embodiment 12.

FIG. 26 illustrates the configuration of a controller 61 according to Embodiment 12. The controller 61 includes a CPU 62, an arithmetic unit 63, memory modules G(0)-G(3), and a data wiring MIO that is arranged ranging over the memory modules G(0)-G(3).

The memory module G(n) includes an in-memory I/O control circuit CT(n).

The memory module G(n) includes multiple memory cell arrays explained in Embodiment 1-Embodiment 9. The data wiring MIO is arranged ranging over the memory cell arrays M(0)-M(3) in the memory module G(n), as explained in Embodiment 1-Embodiment 9. It is also preferable that the first data wiring MIOT and the second data wiring MION are arranged instead of the data wiring MIO.

The data wiring MIO is divided by the in-memory I/O control circuits CT(0)-CT(3) into data wirings MIO(0)-MIO(4).

In the following, the operation of the present semiconductor device is explained.

One of the memory modules G(0)-G(3) is selected by a decoder (not shown), and the in-memory I/O control circuit in the selected memory module is selected. Here, it is assumed that the memory module G(0) and the in-memory I/O control circuit CT(0) are selected.

First, the operation in write is explained.

The CPU 62 outputs the write data to the data wiring MIO(4).

The in-memory I/O control circuit CT(3) is not selected and outputs the write data propagating on the data wiring MIO(4) to the data wiring MIO(3). The in-memory I/O control circuit CT(2) is not selected and outputs the write data propagating on the data wiring MIO(3) to the data wiring MIO(2). The in-memory I/O control circuit CT(1) is not selected and outputs the write data propagating on the data wiring MIO(2) to the data wiring MIO(1). The in-memory I/O control circuit CT(0) is selected and outputs the write data propagating on the data wiring MIO(1) to the data wiring MIO(0). At the same time, the in-memory I/O control circuit CT(0) selects one of the memory cell arrays M(0)-M(3) in the memory module G(0) and transmits the write data to the selected memory cell array. The operation that the write data is transmitted to the selected memory cell array in the memory module G(0) is the same as that in Embodiment 6.

Next, the operation in read is explained. The in-memory I/O control circuit CT(0) is selected; accordingly, the in-memory I/O control circuit CT(0) selects one of the memory cell arrays M(0)-M(3) in the memory module G(0), and receives the read data from the selected memory cell array transmitted via the data wiring MIO(0). The operation that the read data is transmitted from the selected memory cell array in the memory module G(0) is the same as that in Embodiment 6. The in-memory I/O control circuit CT(0) outputs the read data to the data wiring MIO(1).

The in-memory I/O control circuit CT(1) is not selected and outputs the read data propagating on the data wiring MIO(1) to the data wiring MIO(2). The in-memory I/O control circuit CT(2) is not selected and outputs the read data propagating on the data wiring MIO(2) to the data wiring MIO(3). The in-memory I/O control circuit CT(3) is not selected and outputs the read data propagating on the data wiring MIO(3) to the data wiring MIO(4) that is coupled to the CPU 62.

In Embodiment 12, in the un-selected memory module, the data wiring MIO is used as a system bus for coupling the CPU 62 to the selected memory module. In the selected memory module, the data wiring MIO is used as a wiring for writing data into the selected memory cell array or for reading data from the selected memory cell array.

It is possible to apply Embodiment 12 to the system-level configuration represented by an SOC chip, etc. When the bus wiring is made up in a hierarchy bus configuration, the application is not restricted to a semiconductor chip. For example, it is possible to apply Embodiment 12 also for the bus wiring coupling among the device elements on a multilayer system substrate. Furthermore, it is possible to apply Embodiment 12 also to the case where the vertical coupling path is configured as the bus wiring, in coupling multiple semiconductor chips in the vertical direction using the TSV technology.

ADDITIONAL REMARK (Claim A)
A semiconductor device comprises:
a plurality of memory modules;
a data wiring arranged ranging over the memory cell arrays; and
a CPU coupled to one end of the data wiring and to output data to the data wiring or to receive data from the data wiring.

Each of the memory modules includes multiple memory cell arrays. The data wiring is arranged ranging over the memory cell arrays.

In a memory module that is selected among the memory modules, the data wiring functions as a wiring that transmits the data of the selected memory module. In at least one memory module that is not selected among the memory modules and that is located between the CPU and the selected memory module, the data wiring functions as a wiring that transmits the data of the selected memory module. In a memory cell array that is selected among the memory cell arrays in the selected memory module, the data wiring functions as a wiring that transmits the data of the selected memory cell array. In at least one memory cell array that is not selected among the memory cell arrays and is located between the CPU and the selected memory cell array, the data wiring functions as a wiring that transmits the data of the selected memory cell array.

As described above, the invention accomplished by the present inventors has been concretely explained based on the embodiments. However, it cannot be overemphasized that the present invention is not restricted to the embodiments as described above, and it can be changed variously in the range which does not deviate from the gist.

What is claimed is:
1. A semiconductor device comprising:
a plurality of memory cell arrays, each including a plurality of memory cells;
a data wiring arranged ranging over the memory cell arrays;
a data circuit coupled to the data wiring to output data to the data wiring and to receive data from the data wiring; and
a data transmission control circuit provided corresponding to each of the memory cell arrays,
wherein, in a selected memory cell array among the memory cell arrays, the data wiring functions as a local wiring to transmit data of a selected memory cell,
wherein, in at least one memory cell array that is not selected among the memory cell arrays and that is located between the data circuit and the selected memory cell array, the data wiring functions as a global wiring to transmit the data of the selected memory cell of the selected memory cell array,
wherein, in the selected memory cell array, the data wiring transmits first read data from the selected memory cell to the corresponding data transmission control circuit, and the data transmission control circuit corresponding to the selected memory cell array 1) generates second read data by amplifying the first read data and 2) outputs the second read data to the data wiring in an adjoining memory cell array arranged in a position nearer to the data circuit than from the selected memory cell array, and
wherein, in the memory cell array that is not selected and is located between the data circuit and the selected memory cell array, the data wiring transmits the second read data to the data circuit.
2. The semiconductor device according to claim 1, further comprising:
wherein, in the memory cell array that is not selected and is located between the data circuit and the selected memory cell array, the data wiring transmits write data outputted from the data circuit,
wherein the data transmission control circuit corresponding to the selected memory cell array receives first write data via the data wiring in an adjoining memory cell array arranged in a position nearer to the data circuit than from the selected memory cell array and generates second write data, and the data wiring in the selected memory cell array transmits the second write data to the selected memory cell.
3. The semiconductor device according to claim 1,
wherein the data transmission control circuit includes a first data transmission control circuit provided corresponding to each of the memory cell arrays,
wherein the data wiring includes a first data wiring and a second data wiring,
wherein the data circuit includes a data output circuit coupled to the first data wiring,
wherein the first data wiring and the second data wiring are divided by a plurality of the first data transmission control circuits,
wherein the first data transmission control circuit is arranged in the position adjoining the corresponding memory cell array and nearer to the data output circuit than from the corresponding memory cell array,
wherein the first data transmission control circuit comprises a first switching circuit and a read amplifier,
wherein, at a time of read, in the selected memory cell array, the first data wiring and the second data wiring transmit differential read data of the selected memory cell, the read amplifier of the first data transmission control circuit corresponding to the selected memory cell array amplifies the read data, and the first switching circuit of the first data transmission control circuit corresponding to the selected memory cell array couples the output of the read amplifier to the first data wiring coupled to the first data transmission control circuit and located near to the data output circuit, and wherein, at the time of read, the first switching circuit of the first data transmission control circuit corresponding to an un-selected repeater memory cell array that is not selected and is located between the data output circuit and the selected memory cell array couples the first data wiring in the un-selected repeater memory cell array to the first data wiring coupled to the first data transmission control circuit and located near to the data output circuit.

4. The semiconductor device according to claim 3 wherein the data transmission control circuit further includes a second data transmission control circuit provided corresponding to each of the memory cell arrays,
wherein the data circuit includes a data input circuit coupled to the second data wiring,
wherein the second data transmission control circuit is arranged in the position adjoining the corresponding memory cell array and nearer to the data input circuit than from the corresponding memory cell array,
wherein the second data transmission control circuit comprises a second switching circuit and a write amplifier,
wherein, at a time of write, the data input circuit outputs write data to the second data wiring,
wherein, at the time of write, the second switching circuit of the second data transmission control circuit corresponding to the un-selected repeater memory cell array that is not selected and is located between the data input circuit and the selected memory cell array couples the second data wiring coupled to the second data transmission control circuit and located near to the data input circuit to the second data wiring in the un-selected repeater memory cell array, and
wherein, at the time of write, the write amplifier of the second data transmission control circuit corresponding to the selected memory cell array generates write data in differential format based on the write data transmitted via the second data wiring that is coupled to the second data transmission control circuit and is located near to the data input circuit, the second switching circuit of the second data transmission control circuit corresponding to the selected memory cell array couples the output of the write amplifier to the first data wiring and the second data wiring in the selected memory cell array, and the first data wiring and the second data wiring in the selected memory cell array transmit the write data in differential format to the selected memory cell.

5. The semiconductor device according to claim 4, further comprising:
a third switching circuit provided corresponding to each of the memory cell arrays,
wherein the third switching circuit is coupled to a power supply of a fixed voltage,
wherein, at the time of read, the third switching circuit corresponding to an un-selected non-repeater memory cell array that is an un-selected memory cell array and is arranged in a position more distant from the data output circuit than the selected memory cell array couples the first data wiring and the second data wiring in the un-selected non-repeater memory cell array to the power supply, and
wherein, at the time of write, the third switching circuit corresponding to an un-selected non-repeater memory cell array that is an un-selected memory cell array and is arranged in a position more distant from the data input circuit than the selected memory cell array couples the first data wiring and the second data wiring in the un-selected non-repeater memory cell array to the power supply.

6. The semiconductor device according to claim 1,
wherein the data wiring includes a first data wiring and a second data wiring,
wherein the data circuit includes a data output circuit and a data input circuit that are coupled to the first data wiring,
wherein the first data wiring and the second data wiring are divided by a plurality of data transmission control circuits,
wherein the data transmission control circuit is arranged adjoining a corresponding memory cell array,
wherein the data transmission control circuit comprises a switching circuit, a read amplifier, and a write amplifier,
wherein, at a time of read, in the selected memory cell array, the first data wiring and the second data wiring transmit differential read data of the selected memory cell, the read amplifier of the data transmission control circuit corresponding to the selected memory cell array amplifies the read data, and the switching circuit of the data transmission control circuit corresponding to the selected memory cell array couples the output of the read amplifier to the first data wiring coupled to the data transmission control circuit and located near to the data output circuit,
wherein, at the time of read, the switching circuit of the data transmission control circuit corresponding to an un-selected repeater memory cell array that is not selected and is located between the data circuit and the selected memory cell array couples the first data wiring in the un-selected repeater memory cell array to the first data wiring coupled to the data transmission control circuit and located near to the data output circuit,
wherein, at a time of write, the data input circuit outputs write data to the first data wiring,
wherein, at the time of write, the switching circuit of the data transmission control circuit corresponding to the un-selected repeater memory cell array couples the first data wiring coupled to the data transmission control circuit and located near to the data input circuit to the first data wiring in the un-selected repeater memory cell array, and
wherein, at the time of write, the write amplifier of the data transmission control circuit corresponding to the selected memory cell array generates write data in differential format based on the write data transmitted via the first data wiring that is coupled to the data transmission control circuit and is located near to the data input circuit, the switching circuit of the data transmission control circuit corresponding to the selected memory cell array couples the output of the write amplifier to the first data wiring and the second data wiring in the selected memory cell array, and the first data wiring and the second data wiring in the selected memory cell array transmit the write data in differential format to the selected memory cell.

7. The semiconductor device according to claim 6,
wherein the data transmission control circuit is coupled to a power supply of a fixed voltage, and
wherein the data transmission control circuit corresponding to the un-selected repeater memory cell array couples the second data wiring in the un-selected repeater memory cell array to the power supply.

8. The semiconductor device according to claim 1,
wherein the data wiring includes a first data wiring and a second data wiring,
wherein the data circuit includes a data output circuit coupled to the first data wiring and the second data wiring,
wherein the first data wiring and the second data wiring are divided by the data transmission control circuits,
wherein the data transmission control circuit is arranged in the position adjoining the corresponding memory cell array and nearer to the data output circuit than from the corresponding memory cell array,
wherein the data transmission control circuit comprises a switching circuit and a read amplifier,
wherein, at a time of read, in the selected memory cell array, the first data wiring and the second data wiring transmit first differential read data from the selected memory cell and succeeding second differential read data, the read amplifier of the data transmission control circuit corresponding to the selected memory cell array amplifies the first differential read data to generate first single-phase read data, and amplifies the second differential read data to generate second single-phase read data,
wherein, at the time of read, the switching circuit of the data transmission control circuit corresponding to the selected memory cell array outputs the first single-phase read data to one of the first data wiring and the second data wiring that are coupled to the data transmission control circuit and located near to the data output circuit, and outputs the second single-phase read data to the other of the first data wiring and the second data wiring that are coupled to the data transmission control circuit and located near to the data output circuit, and
wherein, at the time of read, the switching circuit of the data transmission control circuit corresponding to an un-selected repeater memory cell array that is not selected and is located between the data output circuit and the selected memory cell array couples the first data wiring and the second data wiring in the un-selected repeater memory cell array, respectively, to the first data wiring and the second data wiring that are coupled to the data transmission control circuit and are located near to the data output circuit.

9. The semiconductor device according to claim 8,
wherein the data circuit includes a data input circuit coupled to the first data wiring and the second data wiring,
wherein the data transmission control circuit further comprises a write amplifier,
wherein, at a time of write, the data input circuit outputs first write data to the first data wiring and outputs second write data to the second data wiring at the same time,
wherein, at the time of write, the switching circuit of the data transmission control circuit corresponding to the un-selected repeater memory cell array that is not selected and is located between the data input circuit and the selected memory cell array couples the first data wiring and the second data wiring that are coupled to the data transmission control circuit and are located near to the data input circuit to the first data wiring and the second data wiring in the un-selected repeater memory cell array, respectively,
wherein, at the time of write, the switching circuit of the data transmission control circuit corresponding to the selected memory cell array couples the output of the write amplifier to the first data wiring and the second data wiring in the selected memory cell array, and
wherein, at the time of write, the write amplifier of the data transmission control circuit corresponding to the selected memory cell array receives the first write data transmitted via the first data wiring and the second write data transmitted via the second data wiring, both data wirings being coupled to the data transmission control circuit and located near to the data input circuit, generates first differential write data based on the first write data and subsequently second differential write data based on the second write data, and the first data wiring and the second data wiring in the selected memory cell array transmit the first differential write data and subsequently the second differential write data, to the selected memory cell.

10. The semiconductor device according to claim 1,
wherein the data circuit includes a data output circuit coupled to the data wiring,
wherein the data wiring is divided by a plurality of the data transmission control circuits,
wherein the data transmission control circuit is arranged in the position adjoining the corresponding memory cell array and nearer to the data output circuit than from the corresponding memory cell array,
wherein the data transmission control circuit comprises a switching circuit and a read amplifier,
wherein, at a time of read, in the selected memory cell array, the data wiring transmits single-phase read data from the selected memory cell, the read amplifier of the data transmission control circuit corresponding to the selected memory cell array amplifies a difference of the read data and a reference voltage, and the switching circuit of the data transmission control circuit corresponding to the selected memory cell array couples the output of the read amplifier to the data wiring that is coupled to the data transmission control circuit and is located near to the data output circuit, and
wherein, at the time of read, the switching circuit of the data transmission control circuit corresponding to an un-selected repeater memory cell array that is not selected and is located between the data output circuit and the selected memory cell array couples the data wiring in the un-selected repeater memory cell array to the data wiring that is coupled to the data transmission control circuit and is located near to the data output circuit.

11. The semiconductor device according to claim 10,
wherein the data circuit includes a data input circuit coupled to the data wiring,
wherein the data transmission control circuit further comprises a write amplifier,
wherein, at a time of write, the data input circuit outputs write data to the data wiring, the switching circuit of the data transmission control circuit corresponding to an un-selected repeater memory cell array that is not selected and is located between the data input circuit and the selected memory cell array couples the data wiring that is coupled to the data transmission control circuit and is located near to the data input circuit to the data wiring in the un-selected repeater memory cell array, and
wherein, at the time of write, the write amplifier of the data transmission control circuit corresponding to the selected memory cell array generates single-phase write data, based on the write data transmitted via the data wiring that is coupled to the data transmission control circuit and is located near to the data input circuit, the switching circuit of the data transmission control circuit corresponding to the selected memory cell array couples the output of the write amplifier to the data wiring in the selected memory cell array, and the data wiring in the selected memory cell array transmits the single-phase write data to the selected memory cell.

12. The semiconductor device according to claim 4,
wherein the first data transmission control circuit includes a first inverter,
wherein the second data transmission control circuit includes a second inverter,
wherein the input of the first inverter is coupled to the first data wiring in the corresponding memory cell array, and the output of the first inverter is coupled to the first switching circuit, and
wherein the input of the second inverter is coupled to the second data transmission control circuit and coupled to the second data wiring located near to the data input circuit, and the output of the second inverter is coupled to the second switching circuit.

13. The semiconductor device according to claim 4,
wherein the data output circuit is coupled to one end of the first data wiring, and
wherein the data input circuit is coupled to one end of both ends of the second data wiring, the one end being located near to the other end of the first data wiring.

14. The semiconductor device according to claim 11,
wherein the data output circuit is coupled to one end of the data wiring, and
wherein the data input circuit is coupled to the other end of the data wiring.

15. A semiconductor device comprising:
a plurality of memory cell arrays;
an address wiring arranged ranging over the memory cell arrays; and
an address circuit coupled to one end of the address wiring and to output an address to the address wiring,
wherein, in a selected memory cell array among the memory cell arrays, the address wiring functions as a local wiring to transmit an address in the selected memory cell array or a redundant address for replacing the address, and in a memory cell array that is not selected among the memory cell arrays and is located between the address circuit and the selected memory cell array, the address wiring functions as a global wiring to transmit an address in the selected memory cell array.

16. A semiconductor device comprising:
a plurality of exclusive selection units;
an address wiring arranged ranging over the exclusive selection units; and
an address circuit coupled to one end of the address wiring and to output an address to the address wiring,
wherein in a selected exclusive selection unit among the exclusive selection units, the address wiring functions as a local wiring to transmit an address of a functional unit in the selected exclusive selection circuit or an address for replacing the address, and in an exclusive selection unit that is not selected among the exclusive selection units and is located between the address circuit and the selected exclusive selection unit, the address wiring functions as a global wiring to transmit an address of a functional unit in the selected exclusive selection unit.

* * * * *